(12) United States Patent
Kuo et al.

(10) Patent No.: US 9,673,248 B2
(45) Date of Patent: Jun. 6, 2017

(54) IMAGE SENSING DEVICE AND MANUFACTURING METHOD THEREOF

(71) Applicant: TAIWAN SEMICONDUCTOR MANUFACTURING COMPANY LTD., Hsinchu (TW)

(72) Inventors: Tsung-Han Kuo, New Taipei (TW); Chung-Chuan Tseng, Hsinchu (TW); Li-Hsin Chu, New Taipei (TW); Zhi-Wei Zhuang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/621,954

(22) Filed: Feb. 13, 2015

(65) Prior Publication Data
US 2016/0240569 A1 Aug. 18, 2016

(51) Int. Cl.
*H01L 27/146* (2006.01)

(52) U.S. Cl.
CPC ...... *H01L 27/1464* (2013.01); *H01L 27/1463* (2013.01); *H01L 27/14612* (2013.01); *H01L 27/14614* (2013.01); *H01L 27/14621* (2013.01); *H01L 27/14623* (2013.01); *H01L 27/14636* (2013.01); *H01L 27/14685* (2013.01); *H01L 27/14689* (2013.01)

(58) Field of Classification Search
CPC .................. H01L 27/1464; H01L 27/14612
See application file for complete search history.

(56) References Cited

U.S. PATENT DOCUMENTS

| | | | |
|---|---|---|---|
| 2002/0190288 A1* | 12/2002 | Lee | H01L 27/14609 257/292 |
| 2011/0102657 A1* | 5/2011 | Takahashi | H01L 23/481 348/308 |

* cited by examiner

*Primary Examiner* — Marc Armand
*Assistant Examiner* — Sarah Salerno
(74) *Attorney, Agent, or Firm* — WPAT, P.C., Intellectual Property Attorneys; Anthony King

(57) ABSTRACT

Some embodiments of the present disclosure provide a back side illuminated (BSI) image sensor. BSI image sensor includes a semiconductive substrate, a dielectric layer over the semiconductive substrate, and a pixel region. The pixel region includes a transistor disposed at a front side of the semiconductive substrate. The transistor includes a gate structure and at least a source region or a drain region. The transistor is coupled to a contact disposed in the dielectric layer. An oxide layer covers the gate structure and at least the source region or the drain region. A nitride layer covers the gate structure and at least the source region or the drain region. A color filter is disposed at a back side of the semiconductive substrate.

20 Claims, 34 Drawing Sheets

IMAGE SENSING DEVICE AND MANUFACTURING METHOD THEREOF

FIELD

The present disclosure relates to a method of manufacturing a back side illuminated (BSI) image sensor.

BACKGROUND

Image sensors are widely used in various imaging applications and products, such as cameras, scanners, photocopiers, etc. A performance of an image sensor is depended on, among other things, its quantum efficiency and dark current.

The quantum efficiency of an image sensor indicates a number of electrons generated per number of incident photons in the image sensor. The dark current occurs when some electric current flows through the image sensor even no photons are entering the image sensor. The dark current is one of sources for noise in the image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
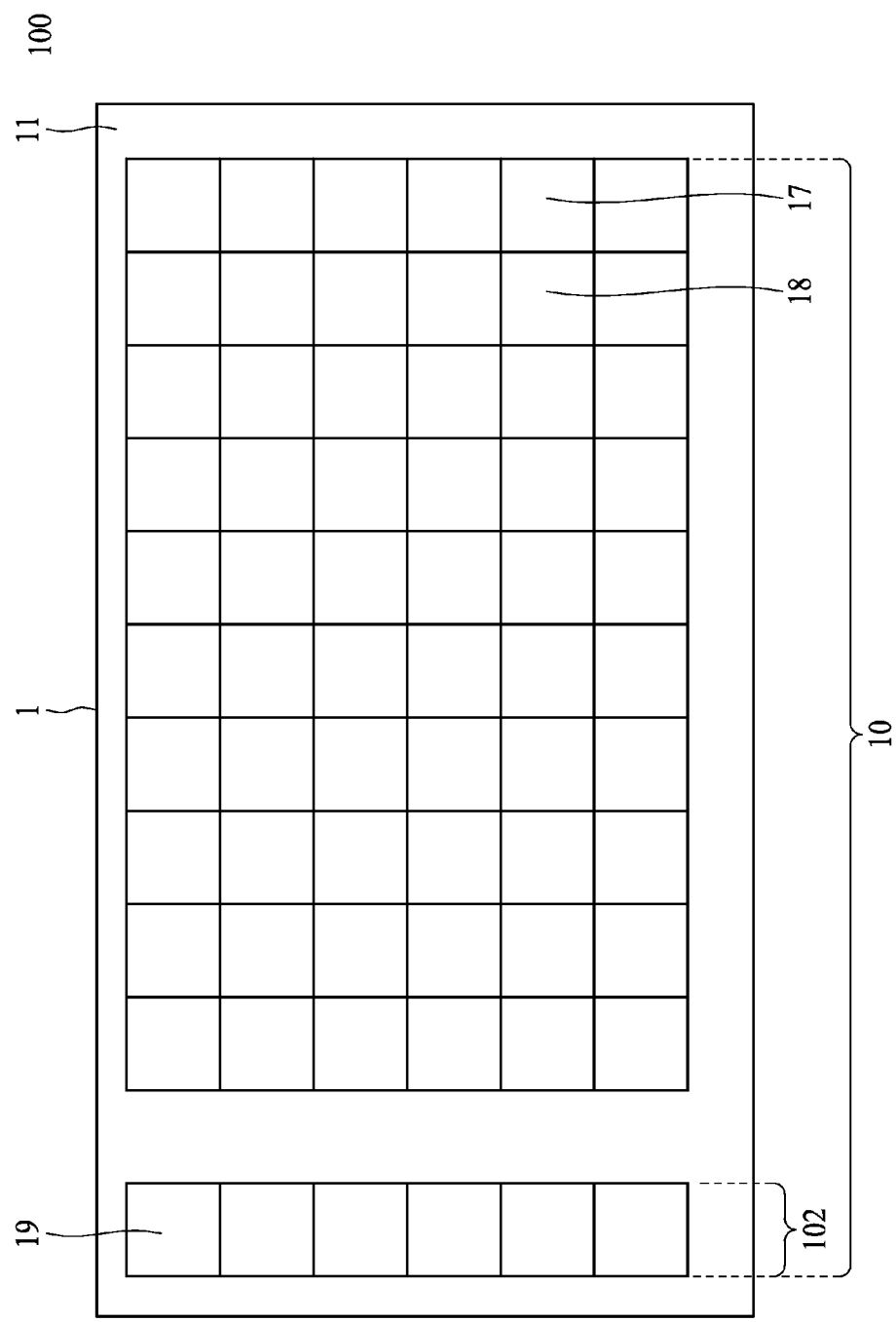
FIG. 1 is a plan view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic plan view of an image sensor 100 in accordance with some embodiments. The image sensor 100 includes a semiconductive substrate 1. The semiconductive substrate 1 includes a pixel region 10 and a logic region 11 outside the pixel region 10. The pixel region 10 includes one or more pixels 17 and 18 arranged therein in an active pixel array. The pixels 17 and 18 are configured to convert light to image data. In some embodiments, the pixel region 10 includes complementary metal-oxide-semiconductor (CMOS), and the image sensor 100 is a CMOS image sensor (CIS). In some embodiments, the pixels 17 and 18 are charged coupled device (CCD) image sensors. In some embodiments, the pixels 17 and 18 are monochromatic pixels. In some other embodiments, the pixels 17 and 18 are color pixels such as blue (B), green (G), or red (R) pixels configured to detect different wavelengths in an incident light. The pixel region 10 further includes one or more black level reference pixels 19 arranged in a black level reference pixel array 102. The black level reference pixels 19 are similar or identical to the pixels 17 and 18, except that light is shielded to prevent the black level reference pixels 19 from receiving light. Thus, image data outputted by the black level reference pixels 19 provides a black level that is referenced for calibrating the image sensor 100 and/or for correcting image data outputted by the pixels 17 or 18. In some embodiments, the black level reference pixels 19 are omitted.

The logic region 11 includes various circuitries for controlling the overall operation of the image sensor 100, outputting and/or processing and/or buffering image data captured by the pixels 17 and 18 and/or black level reference pixels 19, etc. The image sensor 100 includes a semiconductive substrate 1, a plurality of pixels 17 and 18.

Figure 2:
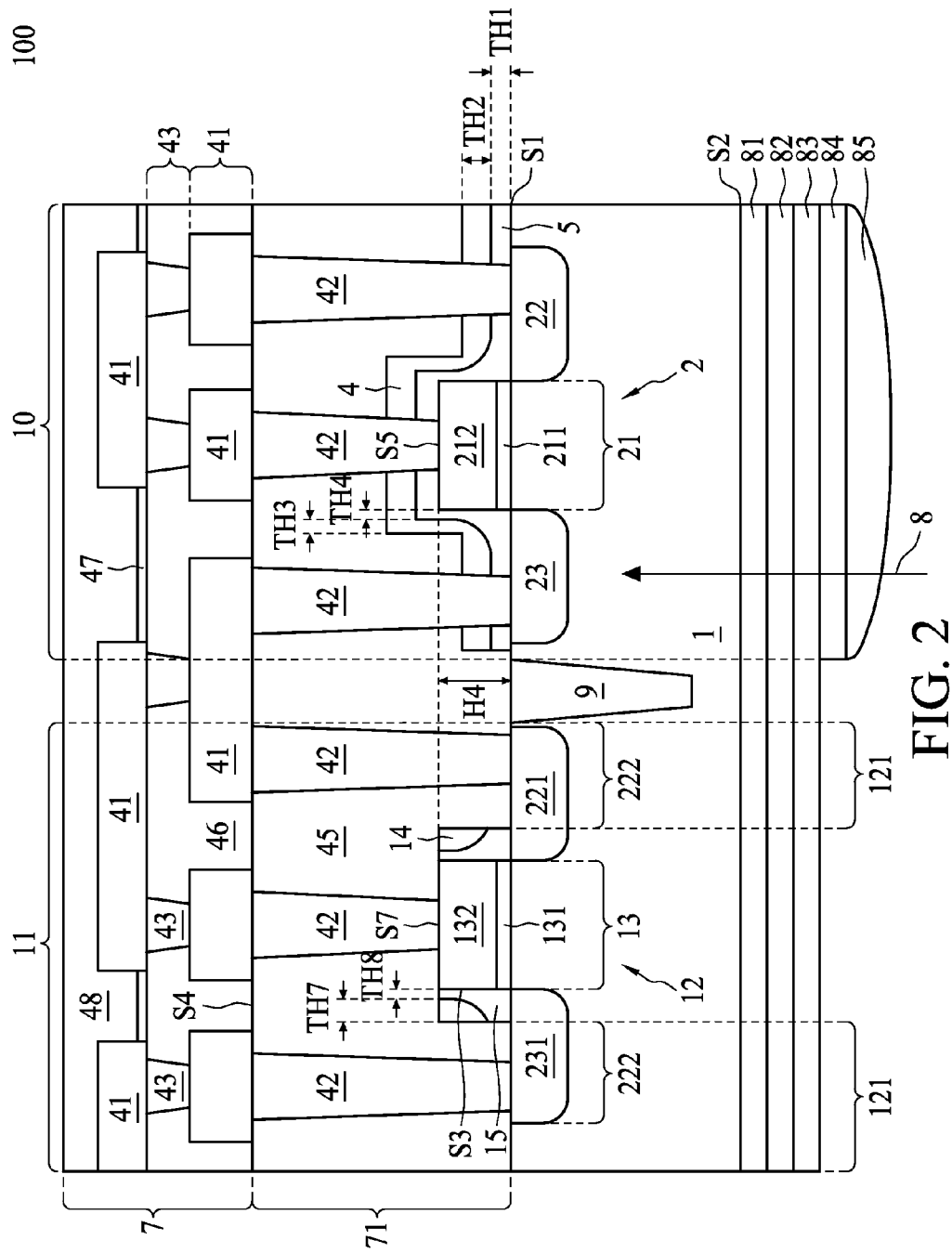
FIG. 2 is a cross-sectional view of an image sensor, in accordance with some embodiments of the present disclosure.

FIG. 2 is a cross sectional view of image sensor 100. In some embodiments, the image sensor 100 is a back side illuminated BSI image sensor. The image sensor 100 includes the pixel region 10 and the logic region 11. The image sensor 100 includes a semiconductive substrate 1 and an isolation region 9. The isolation region 9 is in between the pixel region 10 and the logic region 11.

In an embodiment, the semiconductive substrate 1 is made from silicon. The semiconductive substrate 1 includes bulk silicon, a semiconductor wafer, a silicon-on-insulator (SOI) substrate, or a silicon germanium substrate. Other semiconductor materials including group III, group IV, and group V elements are used in some embodiments. The semiconductive substrate 1 is undoped in some embodiments. In some other embodiments, the semiconductive substrate 1 is doped with a p-type dopant or an n-type dopant. A front side S1 is at a top of the semiconductive substrate 1. A back side S2 is at a bottom of the semiconductive substrate 1.

The semiconductive substrate 1 includes, on the front side S1, the isolation regions 9. In some embodiments, the isolation region 9 is a shallow trench isolation (STI) features or a local oxidation of silicon (LOCOS) features. The isolation regions 9 define and isolate various elements or regions from each other in the semiconductive substrate 1. For example, the isolation regions 9 isolate adjacent pixels from each other, isolate the pixel region 10 from a logic region 11, or isolate some components of the circuitry inside the logic region 11 from each other etc. In some embodiments, the isolation region 9 is made of a dielectric material.

The pixel region 10 includes a transistor 2. The transistor 2 is disposed at a front side S1 of the semiconductive substrate 1. The transistor 2 includes a gate structure 21 and a source region 22 and a drain region 23. The gate structure 21 includes a gate dielectric 211 and a gate electrode 212.

The gate dielectric 211 composes a high-k dielectric layer or combination thereof. The gate dielectric 211 is made of any suitable dielectric material such as hafnium oxide (HfOZ), hafnium silicon oxide (HfSiO), hafnium silicon oxynitride (HfSiON), hafnium tantalum oxide (HMO), hafnium titanium oxide (HfTiO), hafnium Zirconium oxide (HfZrO), metal oxides, metal nitrides, metal silicates, transition metal-nitrides, transition metal-silicates, transition metal-oxides, oxynitrides of metals, metal aluminates, silicon oxide, silicon nitride, silicon oxy-nitride, Zirconium silicate, Zirconium aluminate, aluminum oxide, Zirconium oxide, titanium oxide, hafnium dioxide-alumina alloy, other suitable high-k dielectric materials, and/or combinations thereof. Examples of metal oxides for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or mixtures thereof. In some embodiments, gate dielectric 211 includes an interfacial layer between the gate dielectric 211 and the front side S1 to reduce damages between the gate dielectric 211 and the semiconductive substrate 1.

In some embodiments, the source region 22 or the drain region 23 is a photo-sensitive element configured to receive light 8 (B, G or R). The light 8 is incident upon a microlens 85, transmitted through a color filter 84 and a multilayer structure, into the semiconductive substrate 1, and traveled toward the front side S1. The light 8 is then converted by the photo-sensitive element into image data. The multilayer structure includes a first transmitting layer 81, a second transmitting layer 82, and a capping layer 83. The multilayer structure is disposed at the back side S2 of the semiconductive substrate 1.

The transistor 2 is coupled to the photo-sensitive element to transfer image data to circuitry in the logic region 11 for further processing and/or output. In some embodiments, the photo-sensitive element includes a photosensitive diode, such as a pinned layer photodiode. In some embodiments, the pinned layer photodiode is defined by one or more doped regions in the front side S1 of the semiconductive substrate 1. In some embodiments, the doped regions are in the source region 22 or the drain region 23.

In some embodiments, the transistor 2 is a transfer transistor for transferring the image data captured by a corresponding photo-sensitive element to external circuitry. In some embodiments, additional transistors with various functions are also included in each pixel region 10. For example, a reset transistor, a source follower transistor, and/or a select transistor are included in each pixel region 10 to define together with the transfer transistor a four-transistor CIS. Other CIS arrangements are suitable in some embodiments. The principles described herein are also applicable to CCD pixels in further embodiments. In some embodiments, other transistors in pixel region 10 are structured similarly to the transistor 2.

An oxide layer 5 and a nitride layer 4 are covering conformally over the gate structure 21, the source region 22, the drain region 23, and the front side S1 of the semiconductive substrate 1. The oxide layer 5 contacts with a portion of the gate structure 21, the source region 22, and the drain region 23. A dielectric layer 45 is over the semiconductive substrate 1 in the pixel region 10. The dielectric layer 45 is covering above the oxide layer 5 and the nitride layer 4. The gate structure 21, source region 22, and the drain region 23 of the transistor 2 are coupled to a plurality of contacts 42. The contacts 42 pass through the dielectric layer 45, the oxide layer 5, and the nitride layer 4 such that the contacts 42 connect with some portions of the gate structure 21, the source region 22, or the drain region 23 in the pixel region 10. The contacts 42 are in contact with a portion of a surface S5 of the gate structure 21. In some embodiments, the nitride layer 4 and the oxide layer 5 are symmetric at either side of the gate structure 21. The contacts 42 and the dielectric layer 45 are in an inter-layer dielectric (ILD) layer 71. The nitride layer 4 and the oxide layer 5 separate the dielectric layer 45 from the transistor 2 such that the dielectric layer 45 is not connected with the gate structure 21, the source region 22, and the drain region 23. The oxide layer 5 is between the nitride layer 4 and the semiconductive substrate 1. The nitride layer 4 covers over the oxide layer 5. The nitride layer 4 forms over the front side S1 of the semiconductive substrate 1.

A thickness TH1 of the oxide layer 5 is measured vertically from the front side S1 to a top surface of the oxide layer 5. A thickness TH2 of the nitride layer 4 is measured vertically from a top surface of the oxide layer 5 to a top surface of the nitride layer 4. In some embodiments, a ratio between the thickness TH2 and the thickness TH1 is in a range of approximately 2.4.

A thickness TH4 of the oxide layer 5 is measured horizontally along the surface S5 from the side of the gate structure 21 to a vertical interface between the oxide layer 5 and the nitride layer 4. A thickness TH3 of the nitride layer 4 is measured horizontally along the surface S5 from the vertical interface to a vertical edge of the nitride layer 4. The side of the gate structure 21, the vertical interface, and the vertical edge of the nitride layer 4 are substantially parallel to each other. A sum of the thickness TH3 and thickness TH4 is a thickness of a gate spacer.

In some embodiments, the pixel region 10 includes a color filter 84 disposed at the back side S2 of the semiconductive substrate 1 in the pixel region 10. The back side S2 is opposite of the front side S1. In some other embodiments, the multilayer structure is arranged with an increasing refractive index from air outside the image sensor 100 to the semiconductive substrate 1. Having a refractive index that increases in a transmission direction of the light 8 helps to improve the quantum efficiency of the image sensor 100.

The logic region 11 includes a logic transistor 12. In some embodiments, the logic transistor 12 is disposed at the front side S1 of the semiconductive substrate 1. The logic transistor 12 includes a logic gate structure 13, a logic source region 221, and a logic drain region 231. In some embodiments, the logic source region 221 or the logic drain region 231 are doped region. The logic gate structure 13 includes a logic gate electrode 132 and a logic gate dielectric 131.

The dielectric layer 45 is above the front side S1 of the semiconductive substrate 1 in the logic region 11. The dielectric layer 45 is in contact with a portion of the logic gate structure 13, several portions 222 of the logic source region 221 and the logic drain region 231. The portions 222 are outside of coverage by the logic gate structure 13, a vertical oxide 15, and a vertical nitride 14. The vertical nitride 14 and the vertical oxide 15 are gate spacers lined to either side S3 of the logic gate structure 13. Some of the contacts 42 are penetrating through the dielectric layer 45 from a surface S4 at a top of the ILD layer 71 to a surface S7 at a top of the logic gate structure 13. Some of the contacts 42 are penetrating through the dielectric layer 45 from the surface S4 to the portion 222. The logic gate structure 13, the logic source region 221, and the logic drain region 231 of the logic transistor 12 are coupled to a plurality of contacts 42.

A thickness TH8 of the vertical oxide 15 is measured horizontally along the surface S7 from the side S3 of the logic gate structure 13 to a second vertical interface between the vertical oxide 15 and the vertical nitride 14. A thickness TH7 of the vertical nitride 14 is measured horizontally along the surface S7 from the second vertical interface to a vertical edge of the vertical nitride 14. The side S3 of the logic gate structure 13, the second vertical interface, and the vertical edge of the vertical nitride 14 are substantially parallel to each other. A sum of the thickness TH7 and thickness TH8 is a thickness of a logic gate spacer.

In some embodiments, the thickness TH3 of the nitride layer 4 is substantially equal to or greater than the thickness TH7 of the vertical nitride 14. The thickness TH4 of the oxide layer 5 is substantially equal to the thickness TH8 of the vertical oxide 15. The thickness of the gate spacer is substantially equal to the thickness of the logic gate spacer.

The contacts 42 are disposed in the dielectric layer 45 in the pixel region 10 and the logic region 11. The ILD layer 71 includes the contacts 42 and the dielectric layer 45. The inter-layer dielectric (ILD) layer 71 is over the front side S1 of the semiconductive substrate 1. The ILD layer 71 includes dielectric layer 45 made of material such as, boron phosphorous silicate glass (BPSG), plasma enhanced tetra-ethyl-ortho-silicate (PE-TEOS), or any other suitable dielectric materials.

A redistribution layer 7 is over the dielectric layer 45 and the contacts 42 in the ILD layer 71. The redistribution layer 7 includes an interconnection 41 coupled with the contacts 42.

The transistor 2 in the pixel region 10 is coupled to the logic transistor 12 in the logic region 11 through the contacts 42 and the interconnection 41. The redistribution layer 7 includes alternating some conductive layers and some dielectric layers 46. The conductive layers are patterned and/or otherwise processed to form the interconnections 41 coupled to some underlying devices (e.g., the transistors 2) and/or between the underlying devices and some external circuitries. The interconnections 41 are coupled to the underlying devices through the contacts 42. The interconnection 41 is coupled to another interconnection 41 in other layer through a via 43.

The interconnection 41 in the redistribution layer 7 are in a dielectric layer 46. In some embodiments, the dielectric layer 46 is made of a same material as the dielectric layer 45. The via 43 is over the interconnection 41 to further extend the redistribution layer 7 vertically. Another layer of interconnections 41 is over the vias 43 and the dielectric layer 46. The interconnections 41 connect one via 43 to a plurality of vias 43. In some embodiments, a dielectric etch stop layer 47 is covered over the dielectric layer 46. Another layer of dielectric layer 48 is covered on top of the interconnections 41 and the dielectric etch stop layer 47. In some embodiments, the dielectric layer 48 is made of a same material as the dielectric layer 46 or the dielectric layer 45.

The surface S5 is at a top of the gate structure 21. The surface S7 is at a top of the logic gate structure 13. In some embodiments, the surface S5 and the surface S7 are substantially at a same level above the front side S1 of the semiconductive substrate 1. The surface S5 and the surface S7 are at a height H4 over the front side S1.

Figure 3:
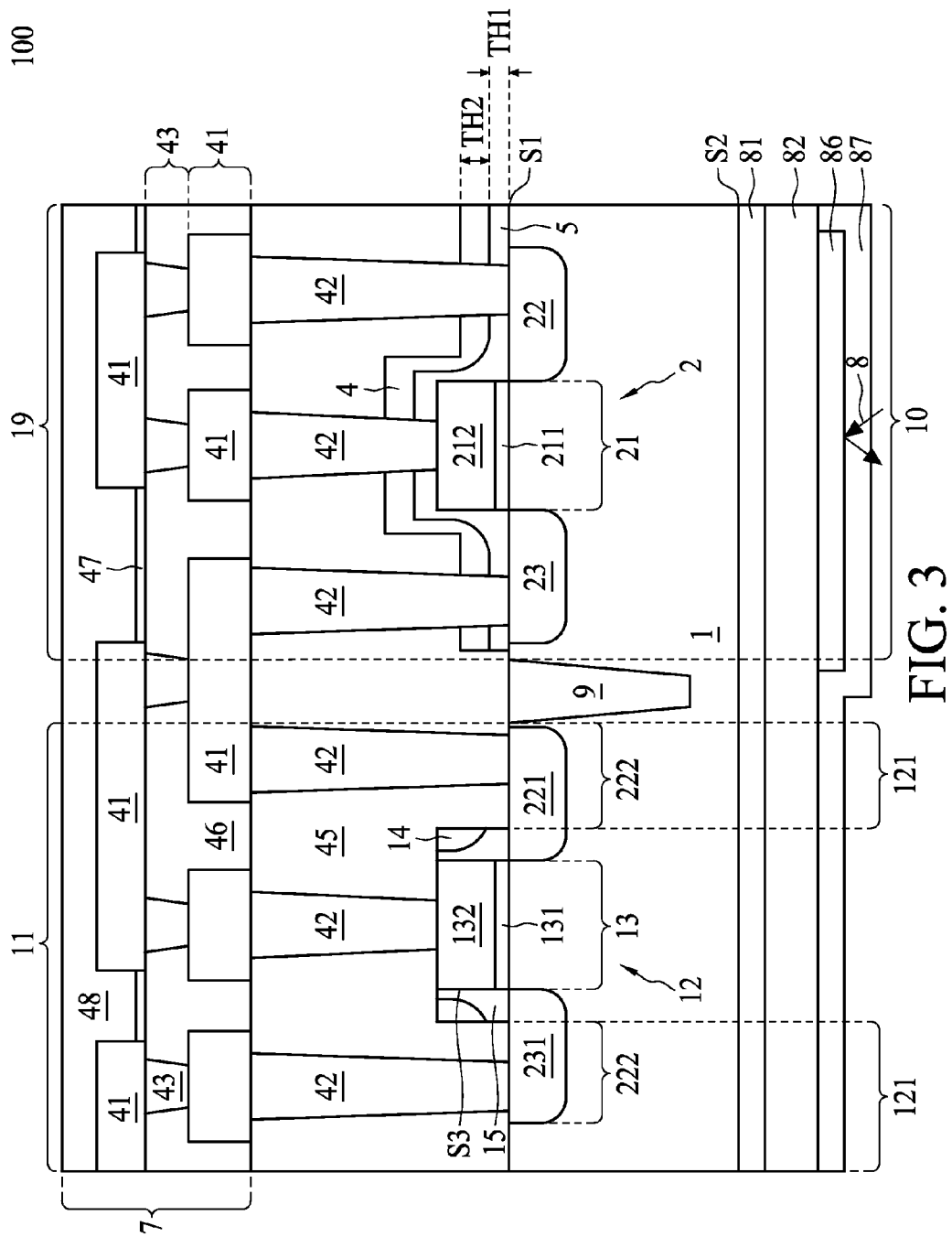
FIG. 3 is a cross-sectional view of an image sensor, in accordance with some embodiments.

FIG. 3 is a cross sectional view of image sensor 100. FIG. 3 illustrated the image sensor 100 including the black level reference pixels 19 and the logic region 11. The isolation region 9 is in between the logic region 11 and the black level reference pixels 19. The black level reference pixel 19 is structured in the pixel region 10. A light shielding layer 86 is over the second transmitting layer 82 to prevent light 8 incidents on the light shielding layer 86 from transmitting to the photo-sensitive element coupled with the transistor 2. The black level reference pixel 19 is configured to output image data from the transistor 2 to the logic transistor 12 through the contacts 42 and the interconnection 41. The light shielding layer 86 is between a passivation layer 87 and the multilayer structure.

Figure 4:
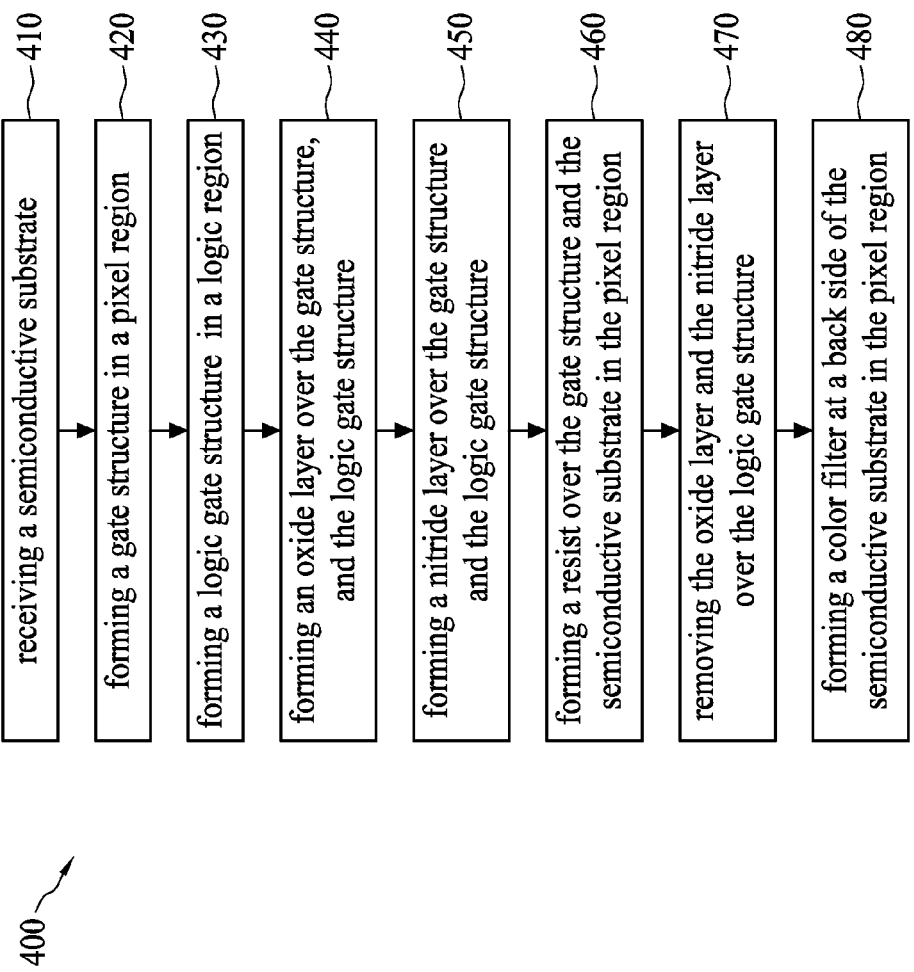
FIG. 4 is an operational flow of a method for manufacturing an image sensor, in accordance with some embodiments.
Figure 7:
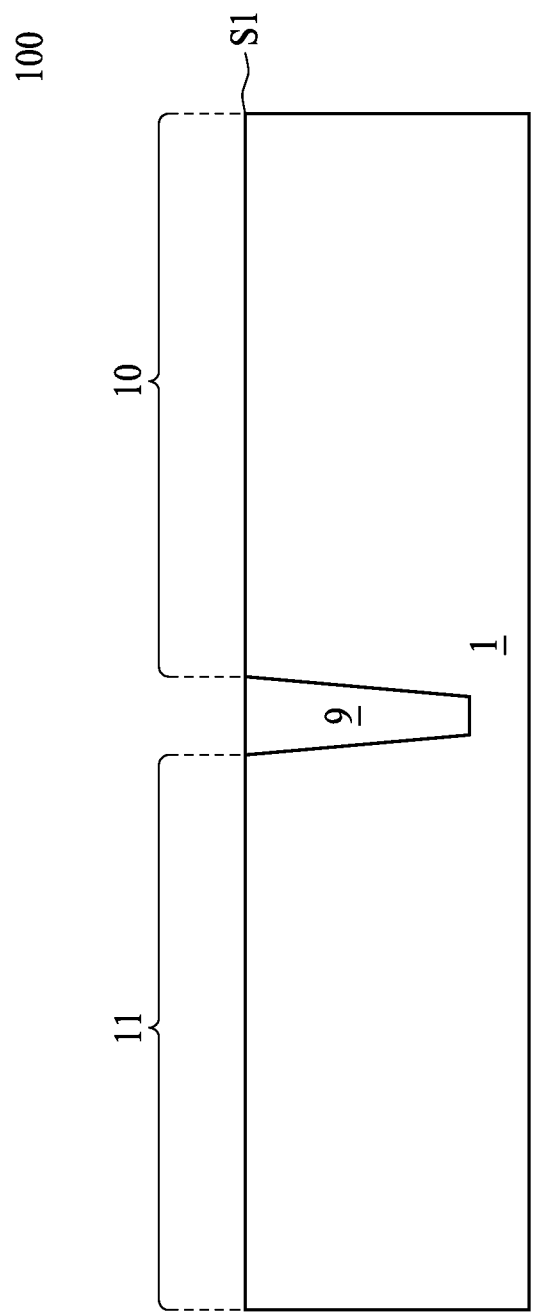
FIGS. 7 to 34 are cross sectional views of an operation in a method for manufacturing an image sensor, in accordance with some embodiments.
Figure 8:
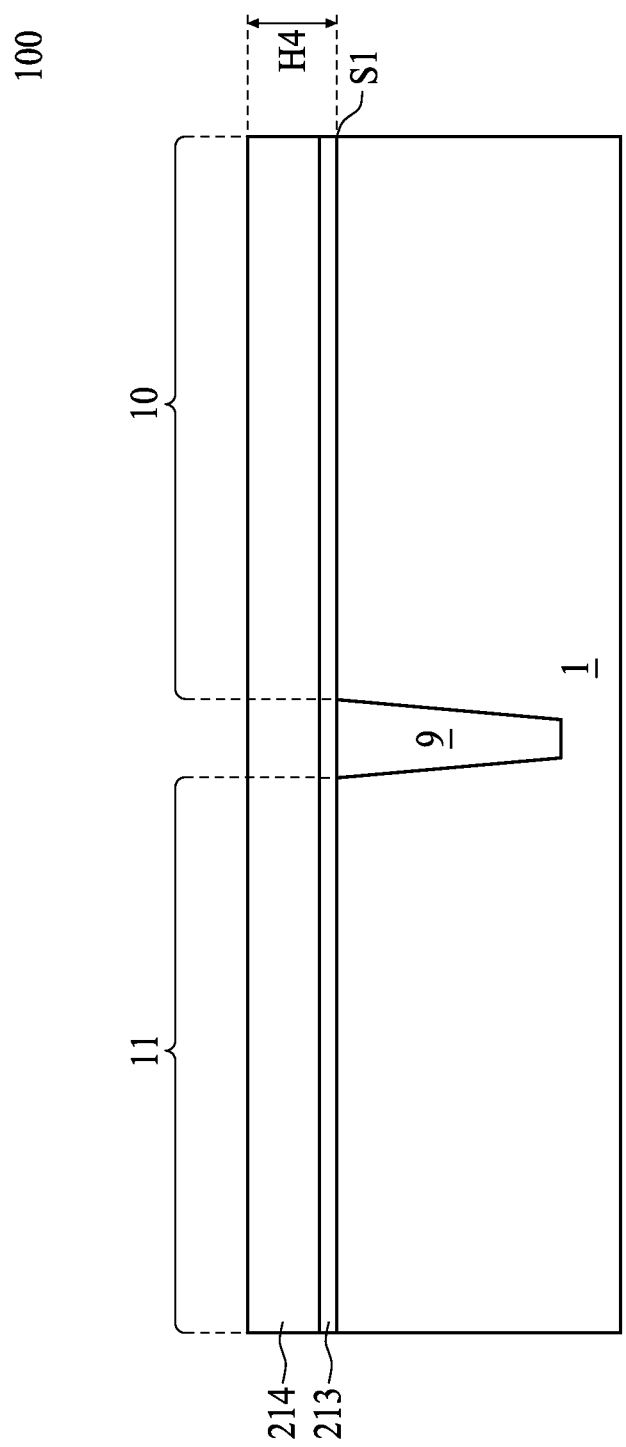
Figure 9:
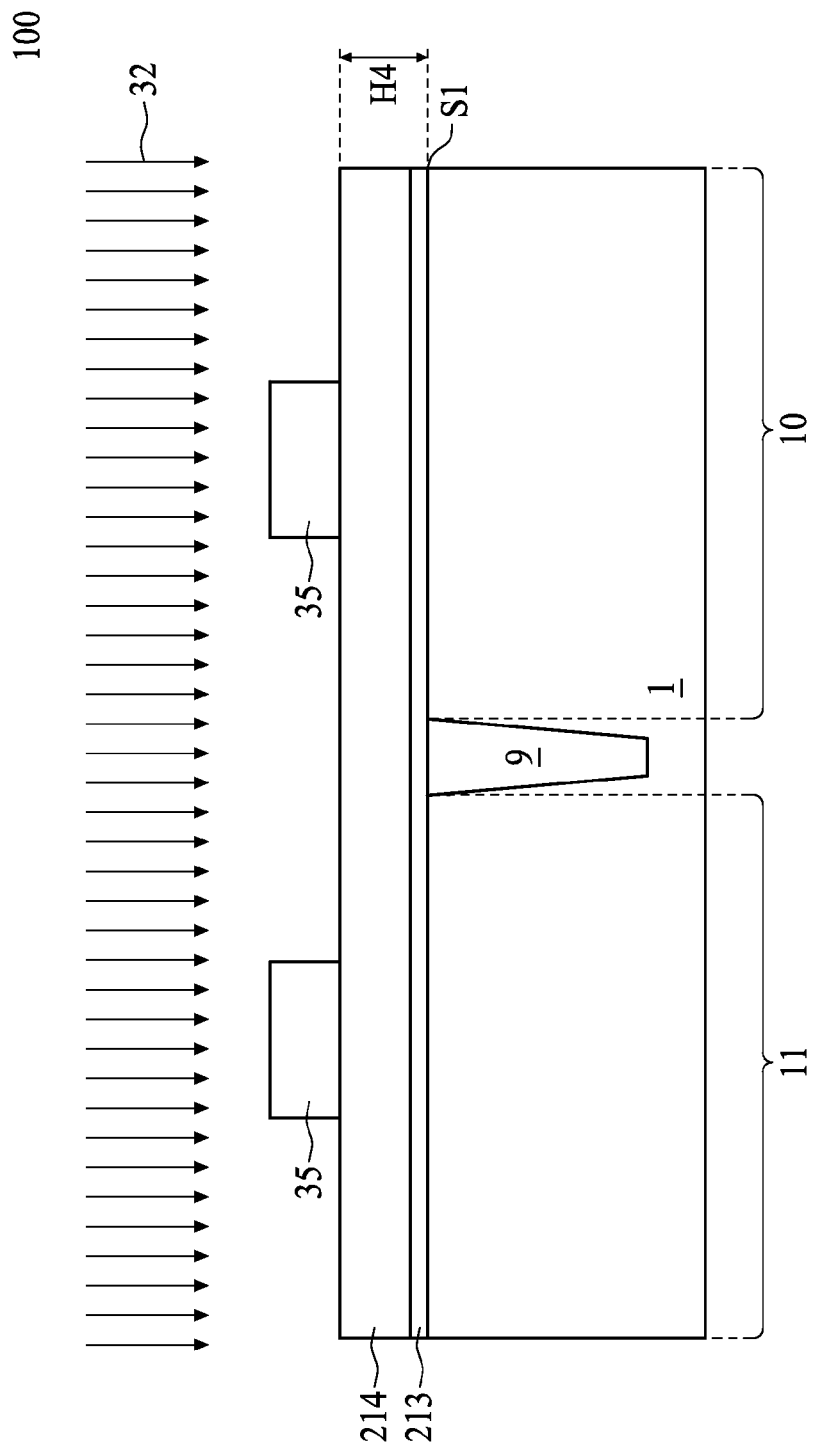
Figure 10:
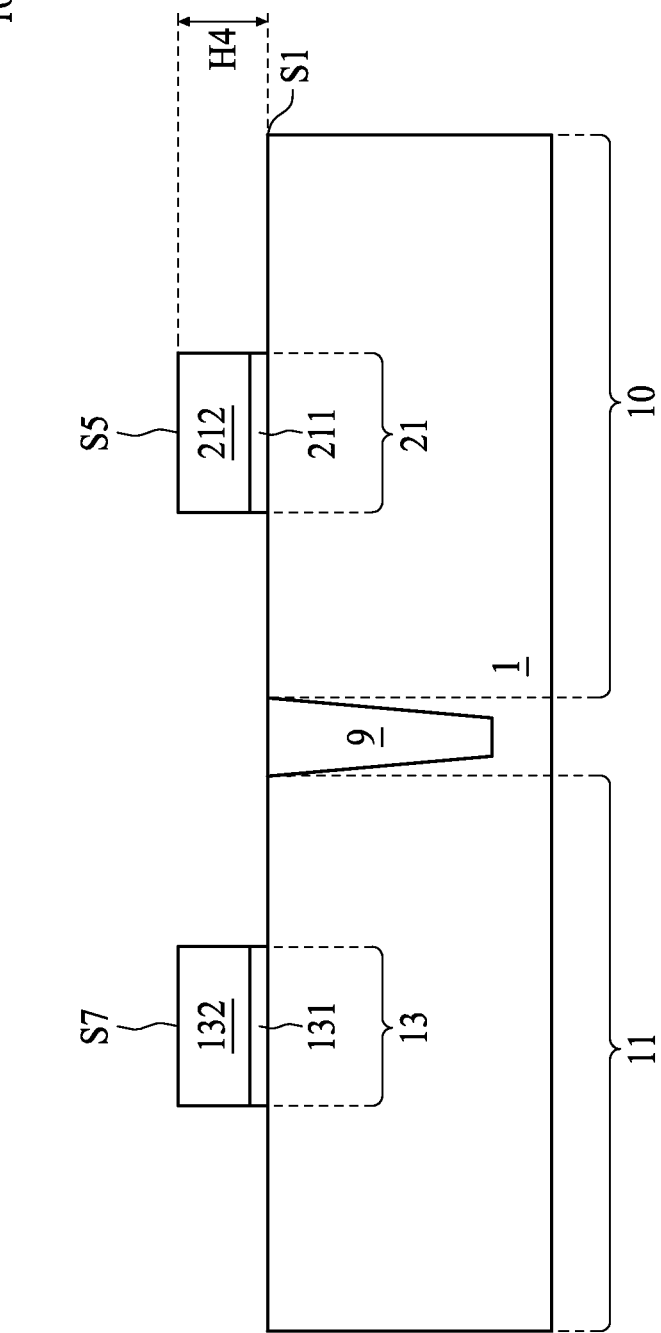
Figure 11:
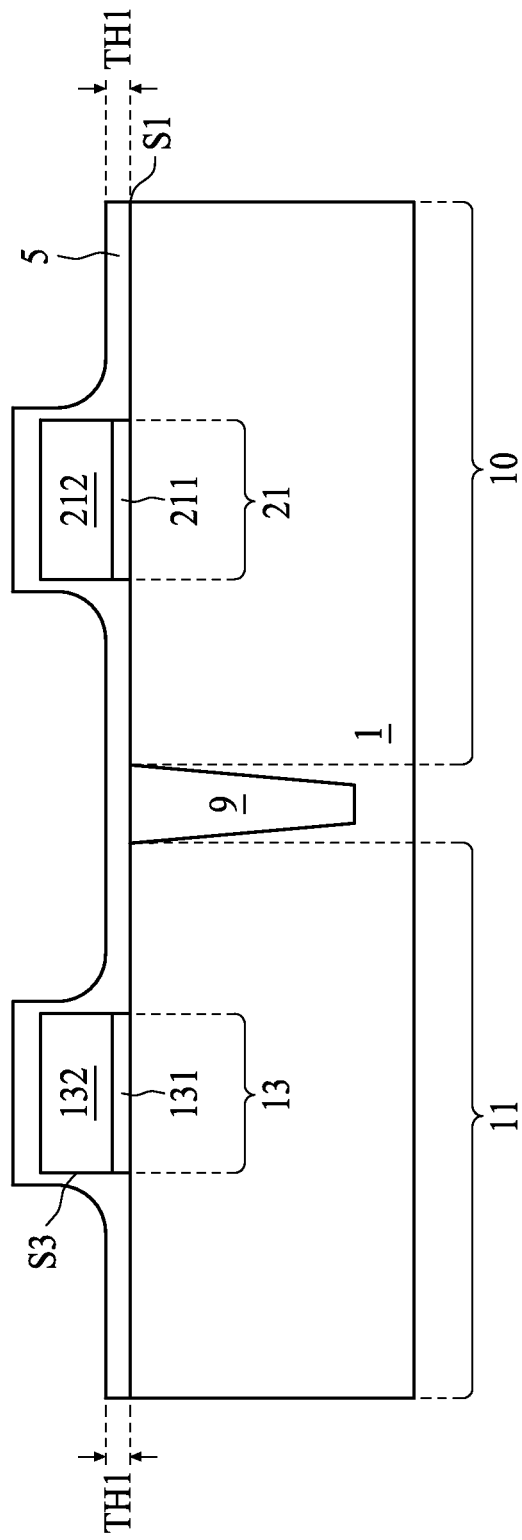
Figure 15:
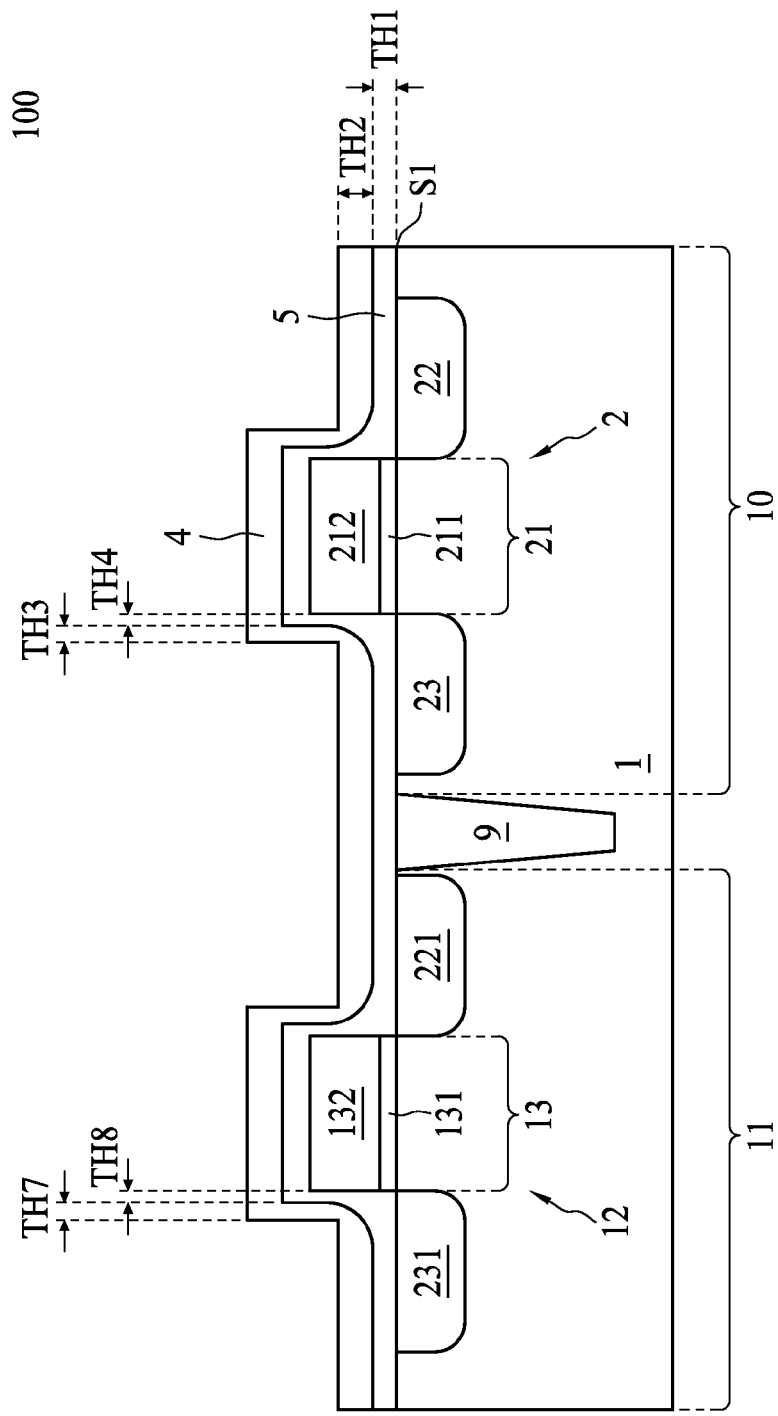
Figure 20:
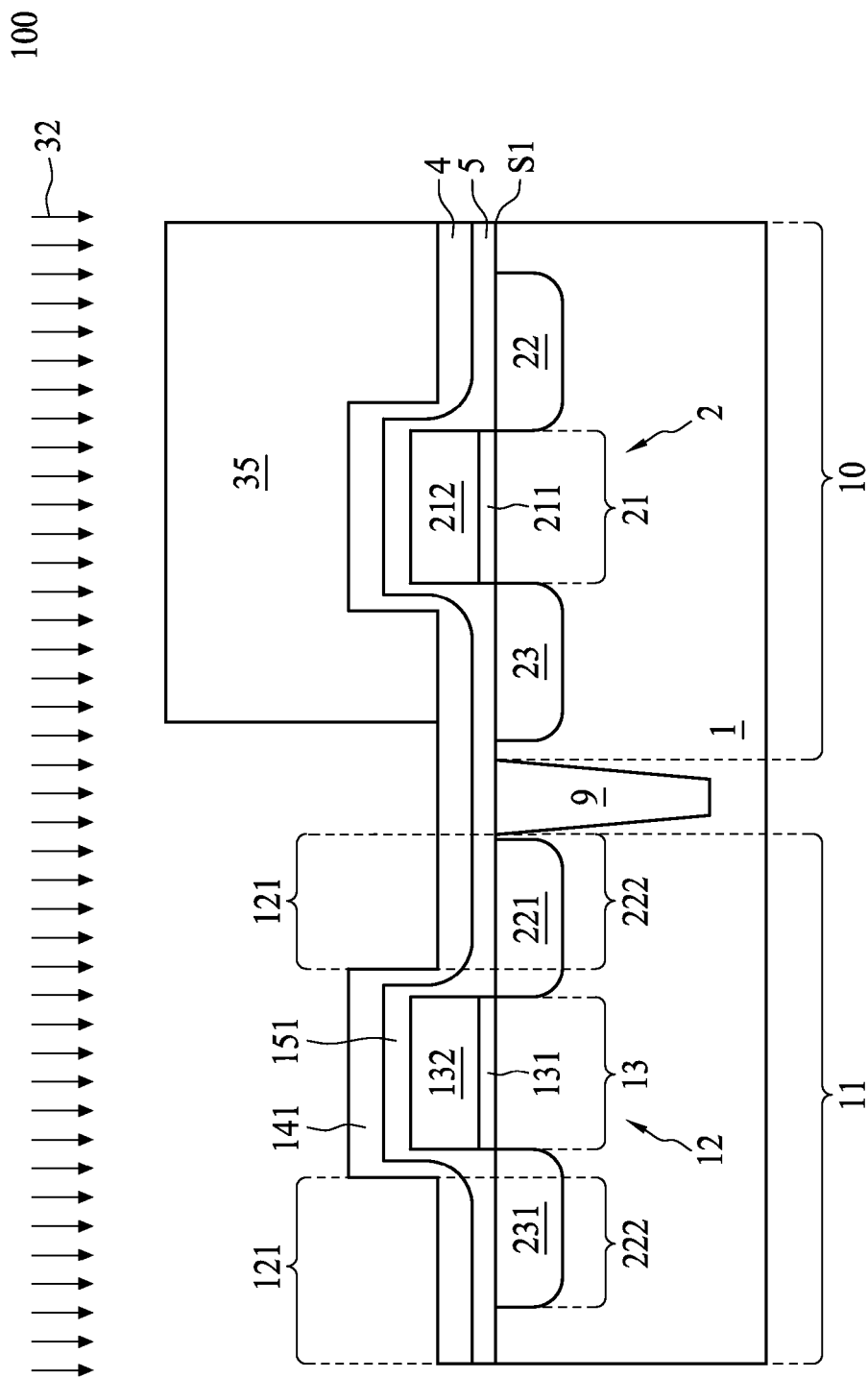
Figure 21:
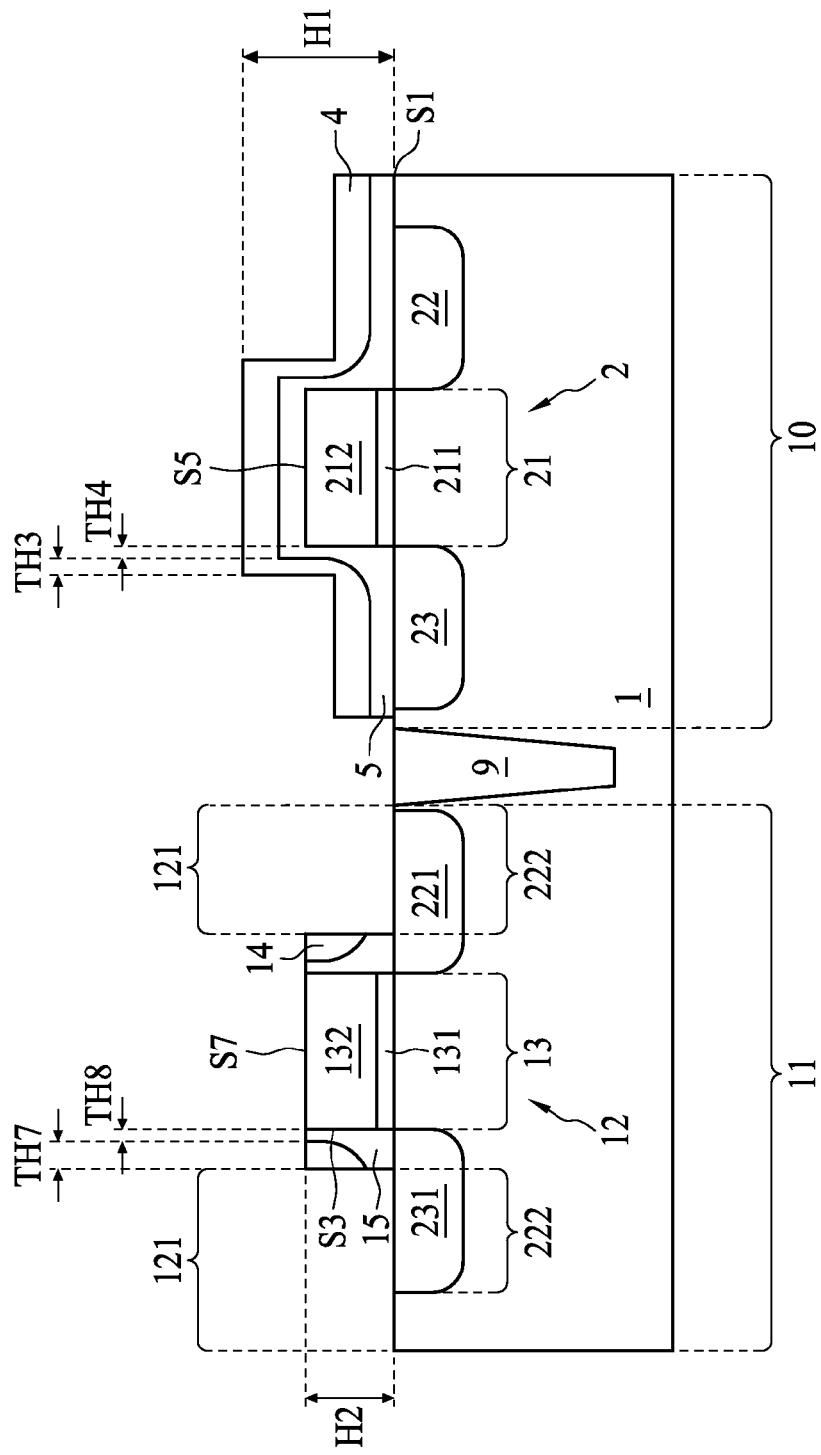
Figure 33:
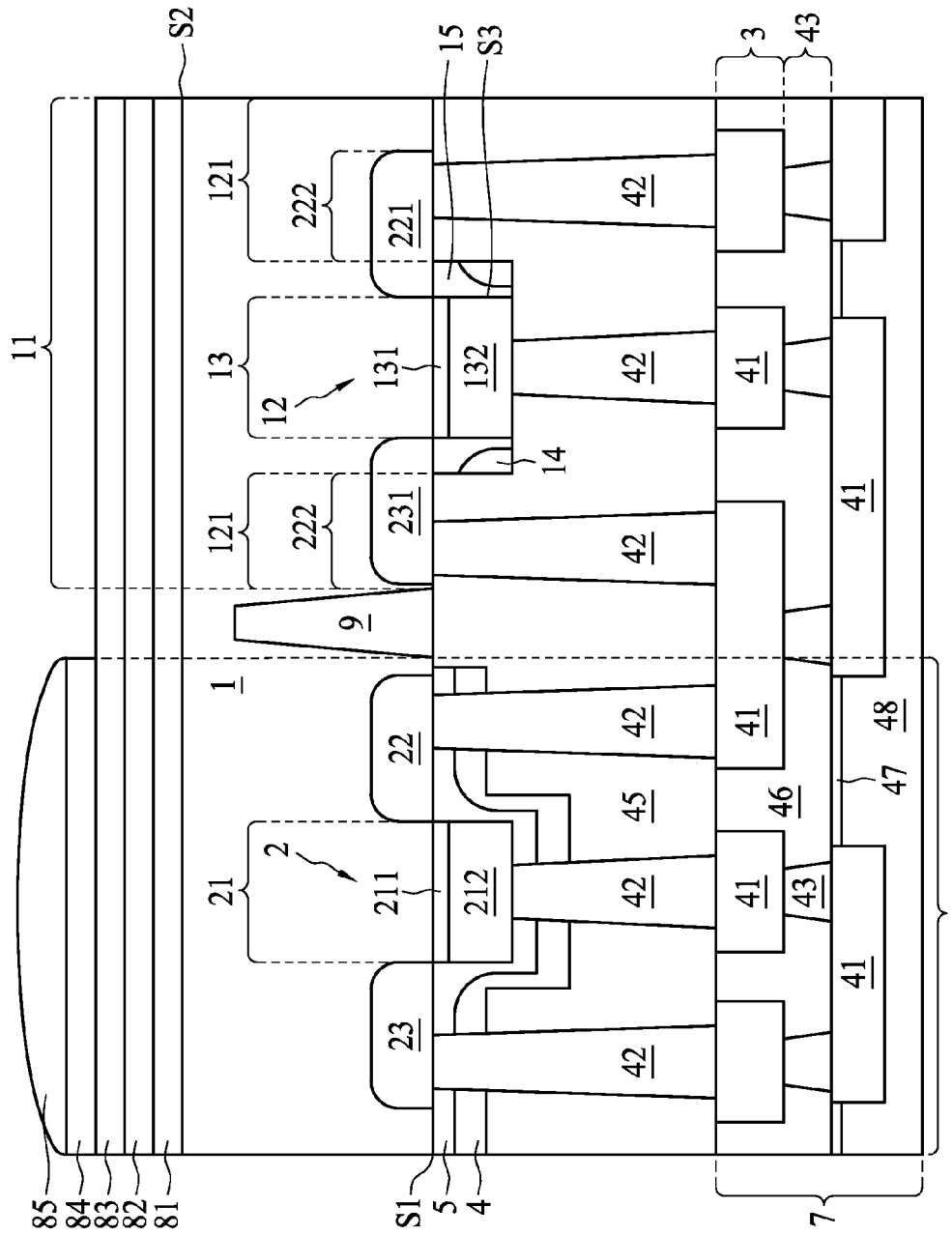

In FIG. 4, a method of manufacturing 400 is illustrated. FIG. 4 illustrates a process flow for forming the image sensor 100 in FIG. 2. Operation 410 receives a semiconductive substrate 1. Some exemplary embodiments for operation 410 are illustrated in FIG. 7. Operation 420 forms a gate structure 21 in a pixel region 10. Some exemplary embodiments for operation 420 are illustrated in FIGS. 8 to 10. Operation 430 forms a logic gate structure 13 in a logic region 11. Some exemplary embodiments for operation 430 are illustrated in FIGS. 8 to 10. Operation 440 forms an oxide layer 5 over the gate structure 21 and the logic gate structure 13. Some exemplary embodiments for operation 440 are illustrated in FIG. 11. Operation 450 forms a nitride layer 4 over the gate structure 21 and the logic gate structure 13. Some exemplary embodiments for operation 450 are illustrated in FIG. 15. Operation 460 forms a resist 35 over the gate structure 21 and the semiconductive substrate 1 in the pixel region 10. Some exemplary embodiments for operation 460 are illustrated in FIG. 20. Operation 470 removes the oxide layer 5 and the nitride layer 4 over the logic gate structure 13. Some exemplary embodiments for operation 470 are illustrated in FIGS. 20 and 21. Operation 480 forms a color filter 84 at a back side S2 of the semiconductive substrate 1 in the pixel region 10. Some exemplary embodiments for operation 480 are illustrated in FIG. 33.

Figure 5:
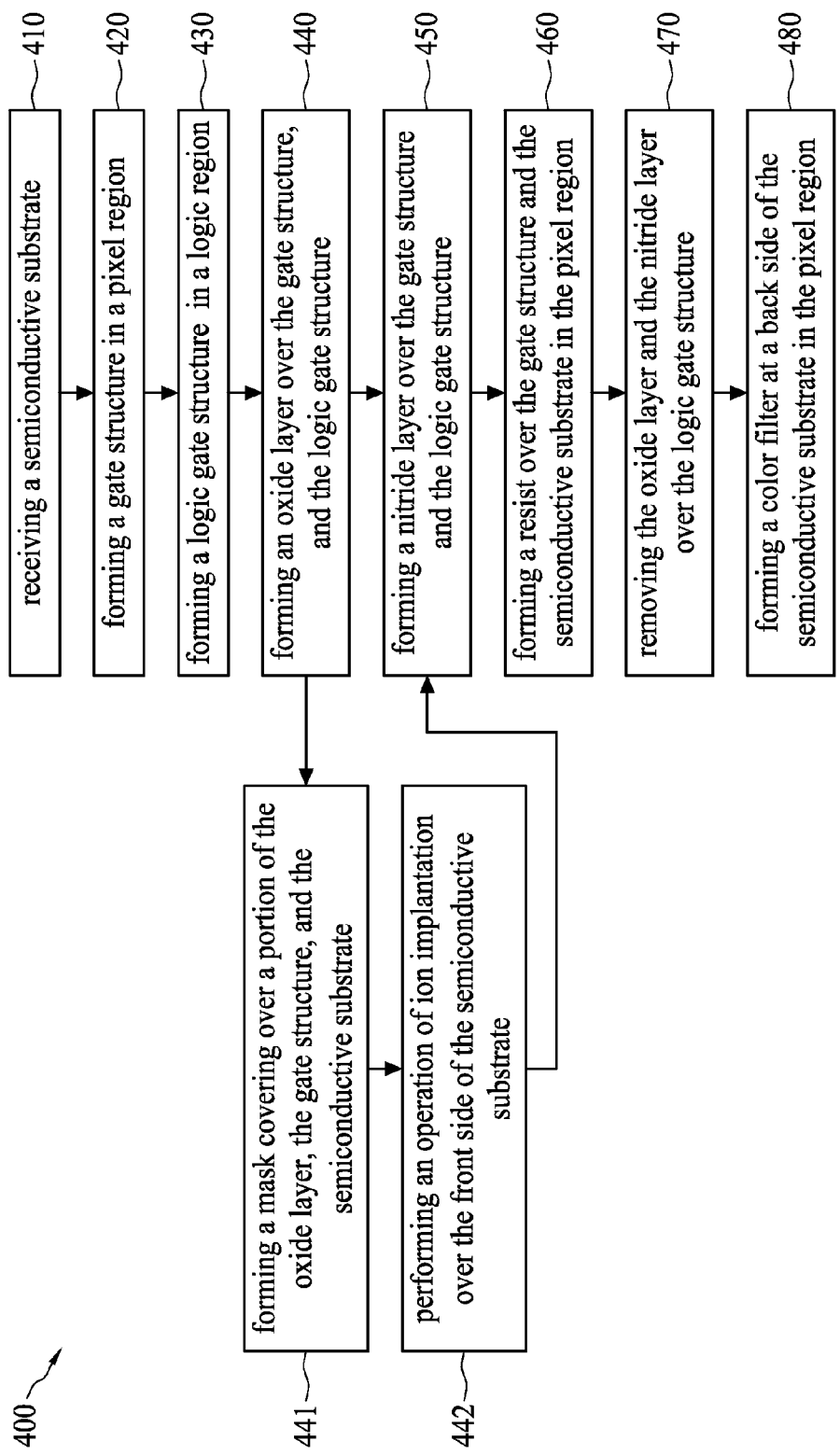
FIG. 5 is an operational flow of a method for manufacturing an image sensor, in accordance with some embodiments.

In FIG. 5, in some embodiments, a method of manufacturing 400 is illustrated. FIG. 5 includes some additional processes such as operation 441 and operation 442 inserted into the process flow for forming the image sensor 100. In FIG. 5, operation 441 is performed after forming an oxide layer 5 over the gate structure 21, and the logic gate structure 13 in operation 440. Operation 441 forms a mask 33 covering over a portion of the oxide layer 5, the gate structure 21, and the semiconductive substrate 1. Some exemplary embodiments for operation 441 are illustrated in FIGS. 12, 13, 17, and 18. Operation 442 performs an operation of ion implantation 31 over the front side S1 of the semiconductive substrate 1. Some exemplary embodiments for operation 442 are illustrated in FIGS. 12, 13, 17, and 18. Operation 442 is followed by forming a nitride layer 4 over the gate structure 21 and the logic gate structure 13 in operation 450

Figure 6:
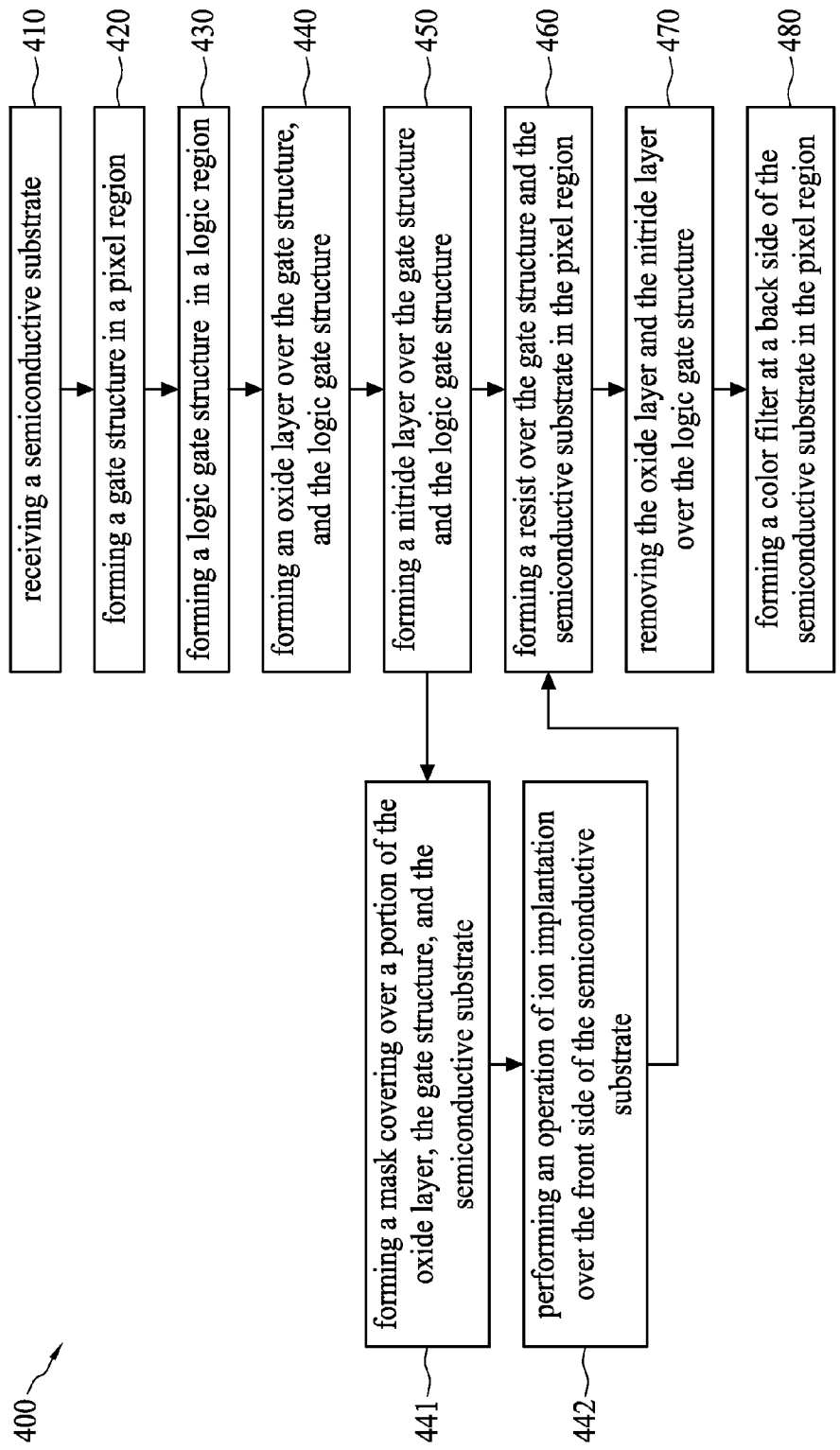
FIG. 6 is an operational flow of a method for manufacturing an image sensor, in accordance with some embodiments.

In FIG. 6, in some other embodiments, a method of manufacturing 400 is illustrated. FIG. 6 includes some additional processes such as operation 441 and operation 442 in the process flow for forming the image sensor 100. In FIG. 6, operation 441 is performed after forming a nitride layer 4 over the gate structure 21, and the logic gate structure 13 in operation 450. Operation 442 is followed by removing the oxide layer 5 and the nitride layer 4 over the logic gate structure 13 in operation 470.

In FIG. 7, the semiconductive substrate 1 is received. The semiconductive substrate 1 includes the isolation region 9 formed by etching a trench in the semiconductive substrate 1 on the front side S1 and filling the trench with insulator materials such as silicon oxide, silicon nitride, or silicon oxynitride.

FIG. 8 illustrates a formation of a gate dielectric layer 213, which is covering over the semiconductive substrate 1. In an embodiment, gate dielectric layer 213 is a thin film formed by a suitable deposition process. A gate electrode layer 214 is covering on top of gate dielectric layer 213. In an embodiment, gate dielectric layer 213 and gate electrode layer 214 are sequentially deposited over semiconductive substrate 1 by some deposition processes. The gate electrode layer 214 is made of polysilicon.

The deposition processes include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The gate electrode layer 214 is deposited up to the height H4 above the front side S1 of the semiconductive substrate 1.

Referring to FIG. 9, the gate dielectric layer 213 and the gate electrode layer 214 are patterned by a lithographic process. In some embodiments, the gate dielectric layer 213 is patterned after the gate electrode layer 214 is patterned. In some embodiments, the lithographic process is a photolithographic process.

In the photolithographic process, a layer of resist 35 is formed over gate electrode layer 214 by a suitable process, such as spin-on coating, and patterned to form a resist feature by a proper photolithography patterning method. The resist feature includes a resist 35 in the pixel region 10 and another resist 35 in the logic region 11. In some embodiments, the resist 35 is a photoresist. The resist feature can then be transferred by an etching process 32 to some underlying layers (i.e., gate electrode layer 214 or gate dielectric layer 213). The resist 35 is stripped thereafter.

As an alternative to traditional photolithography, in some embodiments, a double-patterning lithography (DPL) process is used. The DPL process is a method of constructing a pattern on the gate electrode layer 214 by dividing the pattern into two interleaved patterns. Various DPL methodologies include double exposure (e. g., using two mask sets), forming some spacer adjacent features and removing the spacer adjacent features to provide a pattern of the spacers, photoresist freezing, and/or other suitable processes. In some other embodiments, the photolithography process is implemented or replaced by other proper methods such as maskless photolithography, electron-beam writing, ion-beam writing, and/or molecular imprint.

The etching process 32 is any suitable etching process such as dry etching, wet etching, reactive ion etching (RIE), and/or other etching methods. The etching process 32 is either purely chemical (plasma etching), purely physical (ion milling), and/or combinations thereof.

In FIG. 10, the resist feature is transferred to the underlying layers to form the gate structure 21 on a front side S1 of the semiconductive substrate 1 in the pixel region 10, and the logic gate structure 13 on the semiconductive substrate 1 in the logic region 11. The surface S5 is formed at a top of the gate structure 21. The surface S7 is formed at a top of the logic gate structure 13. In some embodiments, the surface S5 and the surface S7 have the height H4 at substantially a same level from the front side S1.

In FIG. 11, the oxide layer 5 is blanket formed over the gate structure 21, the logic gate structure 13, and the semiconductive substrate 1. The oxide layer 5 is lined to the side of the gate structure 21 and the side S3 of the logic gate structure 13. The oxide layer 5 covers conformally over the gate structure 21 and the logic gate structure 13 by any suitable process such deposition or growth. In some embodiments, oxide layer 5 is blanket deposited by any deposition process including chemical vapor deposition (CVD), atmospheric pressure CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, and/or combination thereof. A thickness TH1 of the oxide layer 5 is controlled by duration of the deposition process.

Figure 12:
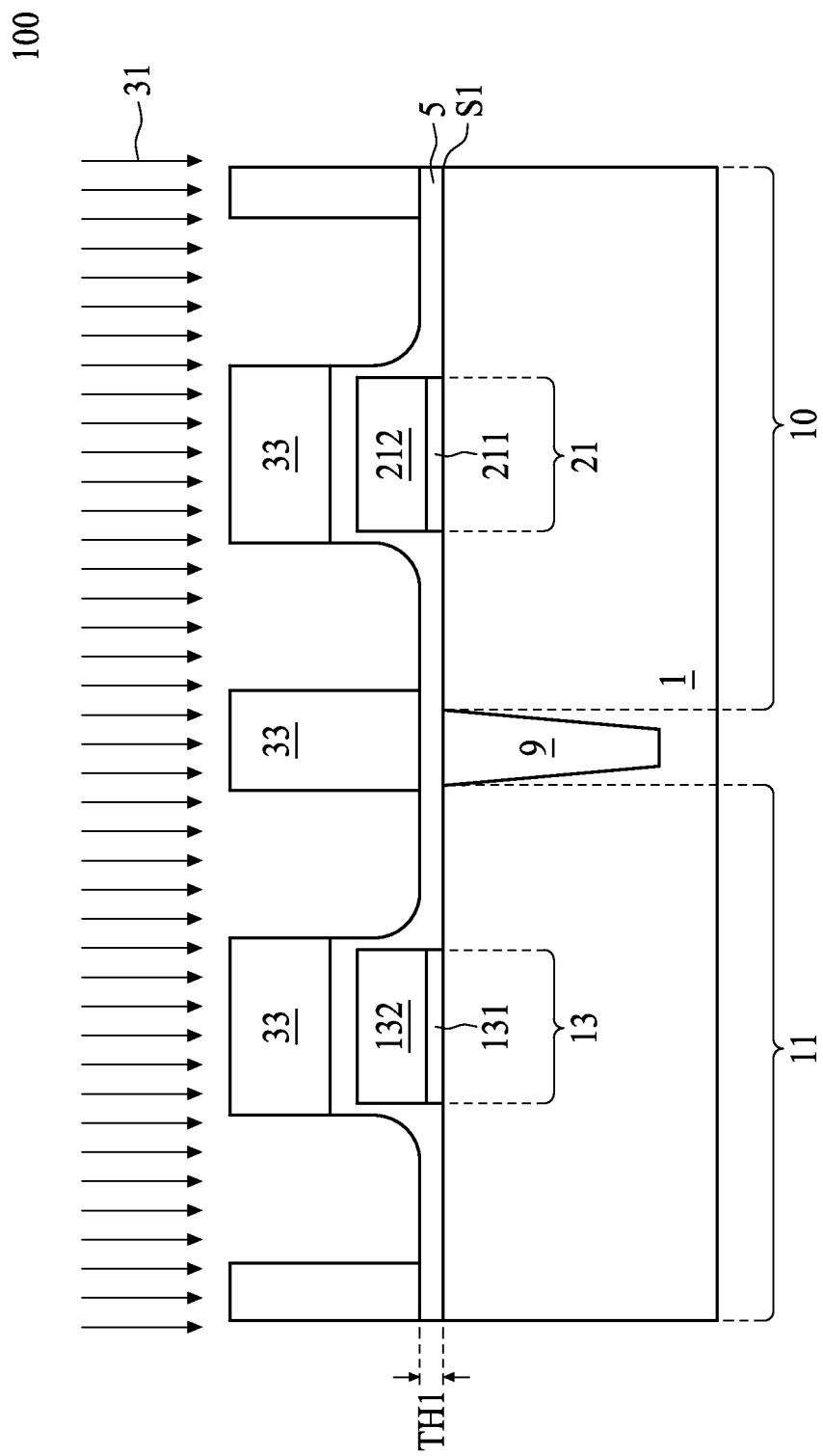

In FIG. 12, in some embodiments, a mask 33 is patterned and covered over a portion of the oxide layer 5 and the semiconductive substrate 1. The portion of the oxide layer 5 is over the gate structure 21 and the logic gate structure 13. The mask 33 is exposing some doping regions and covering some portions of the oxide layer 5. An ion implantation 31 is performed over the semiconductive substrate 1 to implant dopant into some exposed regions. A rapid thermal annealing (RTA) process is used to activate an implanted dopant.

Figure 13:
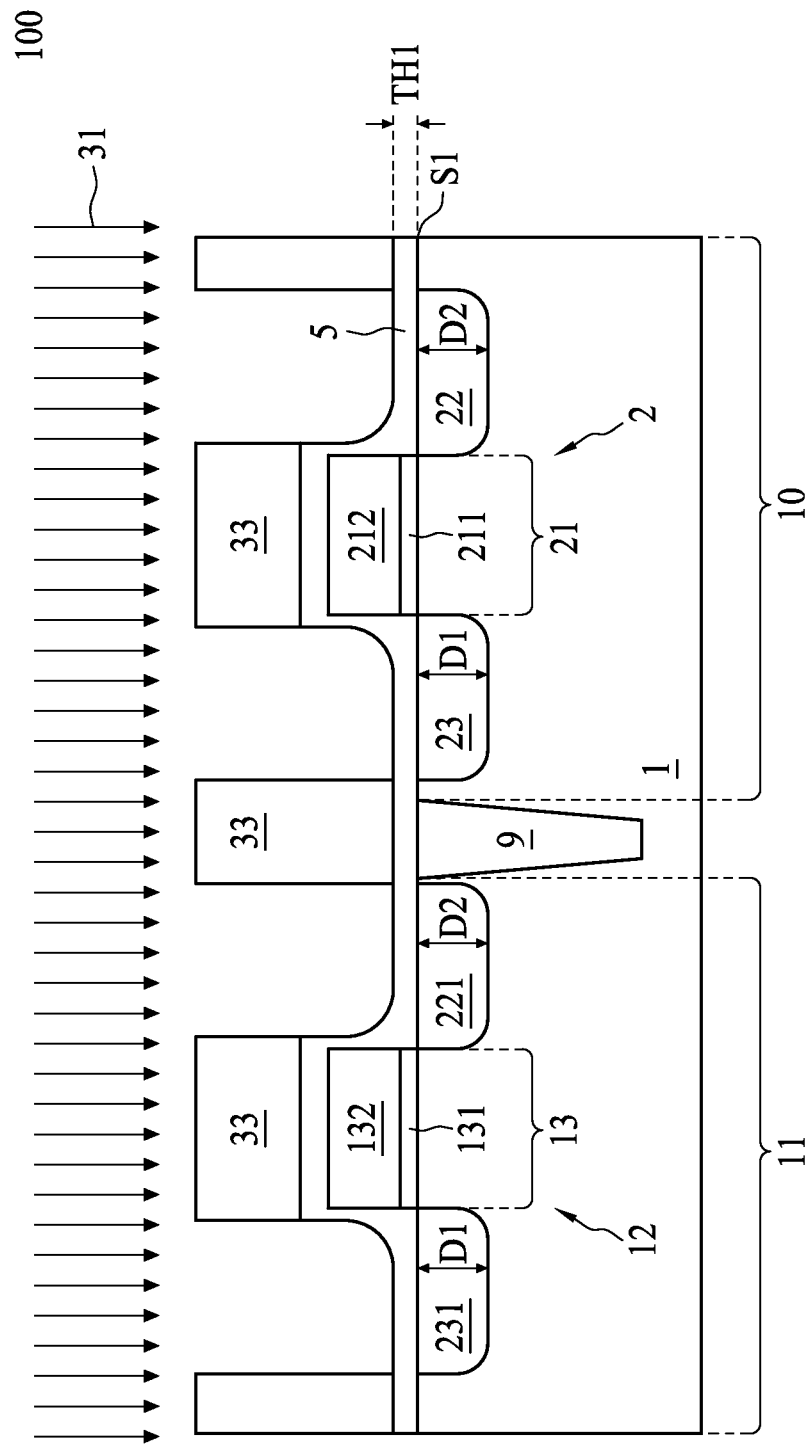

In FIG. 13, in some embodiments, the mask 33 is a photoresist patterned in a photolithography process or other suitable process. An exemplary photolithography process includes photoresist coating, soft baking, pattern aligning, exposing, post-exposure baking, developing, and hard baking. In a doping process, for example, to form the doping regions as logic source region 221, logic drain region 231, source region 22, or drain region 23, mask 33 is formed to cover the portions of the oxide layer 5 outside of these regions. The ion implantation 31 is then performed over the front side S1 of the semiconductive substrate 1 to introduce an n-type impurity, such as arsenic, phosphorous, and the like, or a p-type impurity, such as boron, indium, and the like into the exposed regions of the semiconductive substrate 1. The ion implantation 31 forms the doping regions proximate to some sides of the gate structure 21 and proximate to some sides of the logic gate structure 13.

Figure 14:
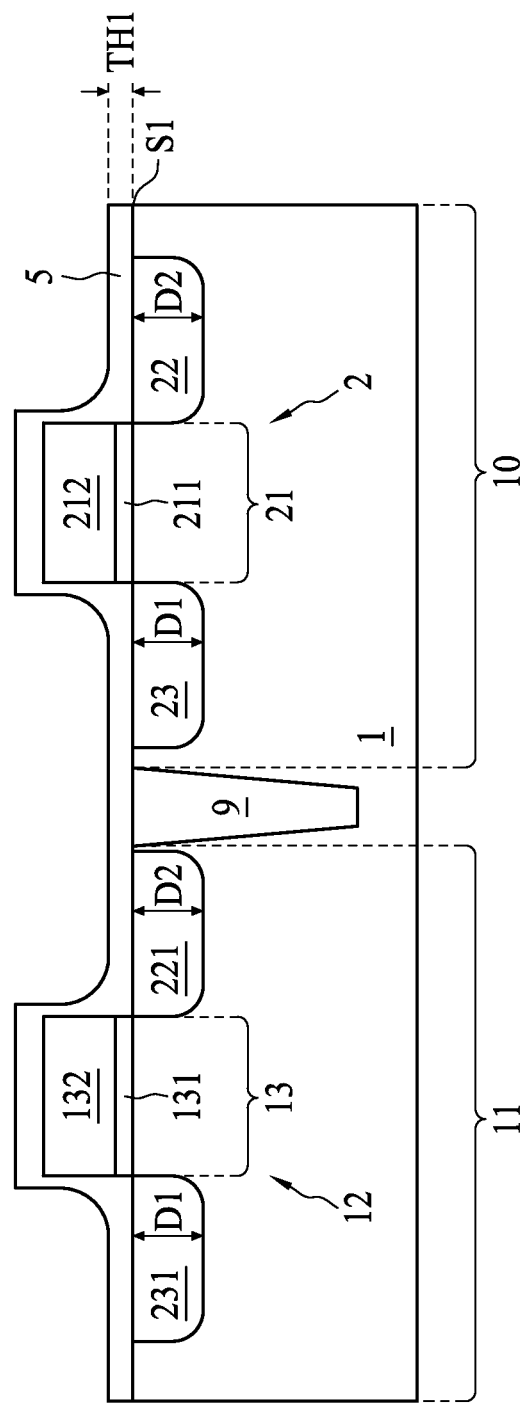

In FIG. 14, after the drain region 23, the logic drain region 231, source region 22, and the logic source region 23 are formed, mask 33 is removed by using an acid in the wet etching.

In FIG. 14, the logic source region 221, logic drain region 231, source region 22, and drain region 23 are formed. Depth D1 of logic drain region 231 and drain region 231 are controlled by some appropriate implantation energies. A depth D2 of logic source region 221 and source region 22 are controlled by some appropriate implantation energies.

In various embodiments, the drain region 23, the logic drain region 231, the source region 22, or the logic source region 221 has different doping profiles formed by a multi-process implantation. For example, the source region 22 is doped to by a p-type dopant, or the logic drain region 231 includes a gradient in a doping concentration of a p-type dopant. In some embodiments, a process to form a doping region in the drain region 23, the logic drain region 231, the source region 22, or the logic source region 221 is performed in some other active regions of the semiconductive substrate 1.

In FIG. 15, the nitride layer 4 is blanket formed over the gate structure 21, the logic gate structure 13, and the semiconductive substrate 1. In some embodiments, the oxide layer 5 is formed between the nitride layer 4 and the gate structure 21. The oxide layer 5 is formed between the nitride layer 4 and the logic gate structure 13. The oxide layer 5 is formed between the nitride layer 4 and the semiconductive substrate 1. The nitride layer 4 follows a contour of the oxide layer 5. The nitride layer 4 covers conformally over the gate structure 21 and the logic gate structure 13 by any suitable process such the deposition process.

In an embodiment, the nitride layer 4 is a thin film formed by a deposition process. The deposition process can include chemical vapor deposition (CVD), physical vapor deposition (PVD), atomic layer deposition (ALD), high density plasma CVD (HDPCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, electrolytic plating, electroless plating, spin-on coating, other suitable methods, and/or combinations thereof.

Figure 16:
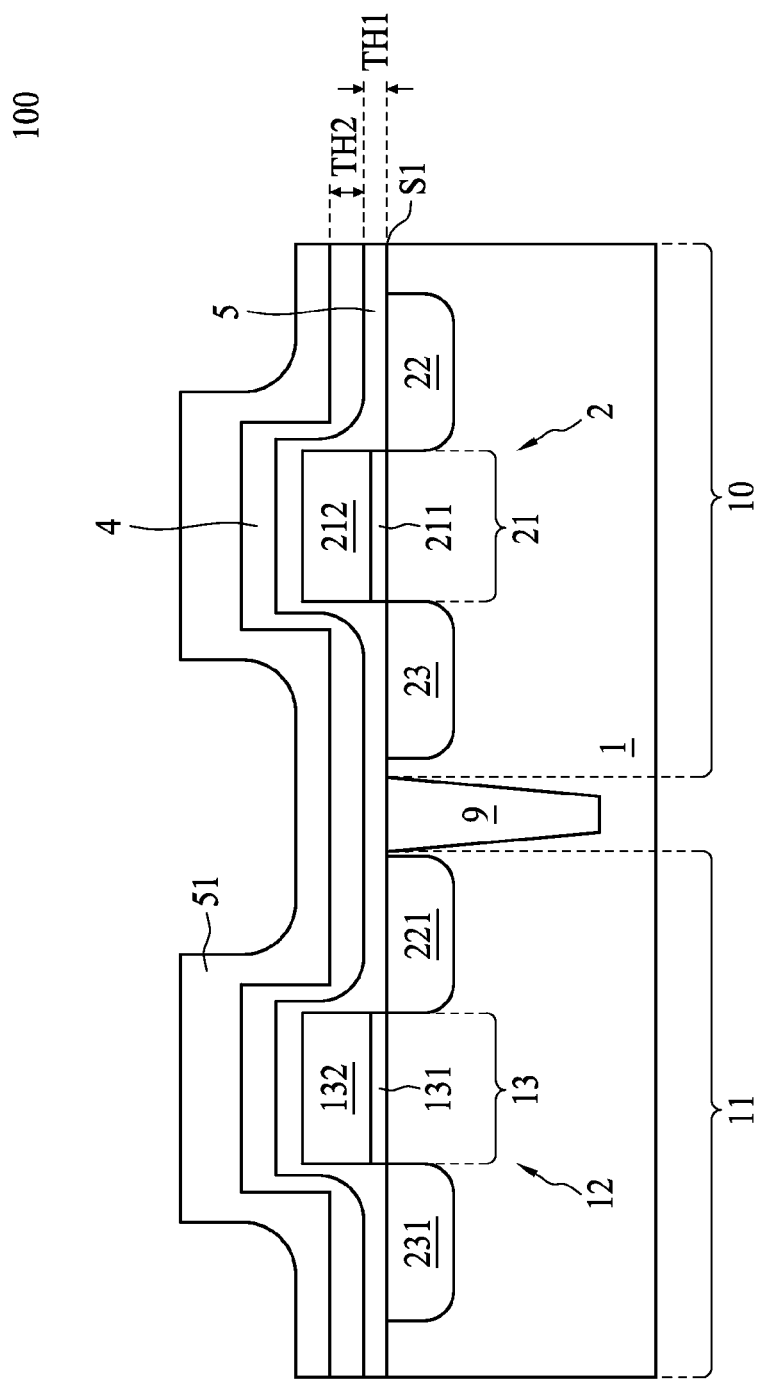

In FIG. 16, in some other embodiments, another oxide layer 51 is overlying on top of nitride layer 4. The other oxide layer 51 is blanket formed over the nitride layer 4 and following a contour of the nitride layer 4. A thickness TH1 of the oxide layer 5 is measured vertically from the front side S1 to a top of the oxide layer 5. A thickness TH2 of the nitride layer 4 is measured vertically from a top of the oxide layer 5 to a bottom of the oxide layer 51. A ratio between the thickness TH2 and the thickness TH1 is in a range of approximately 2.1.

Figure 17:
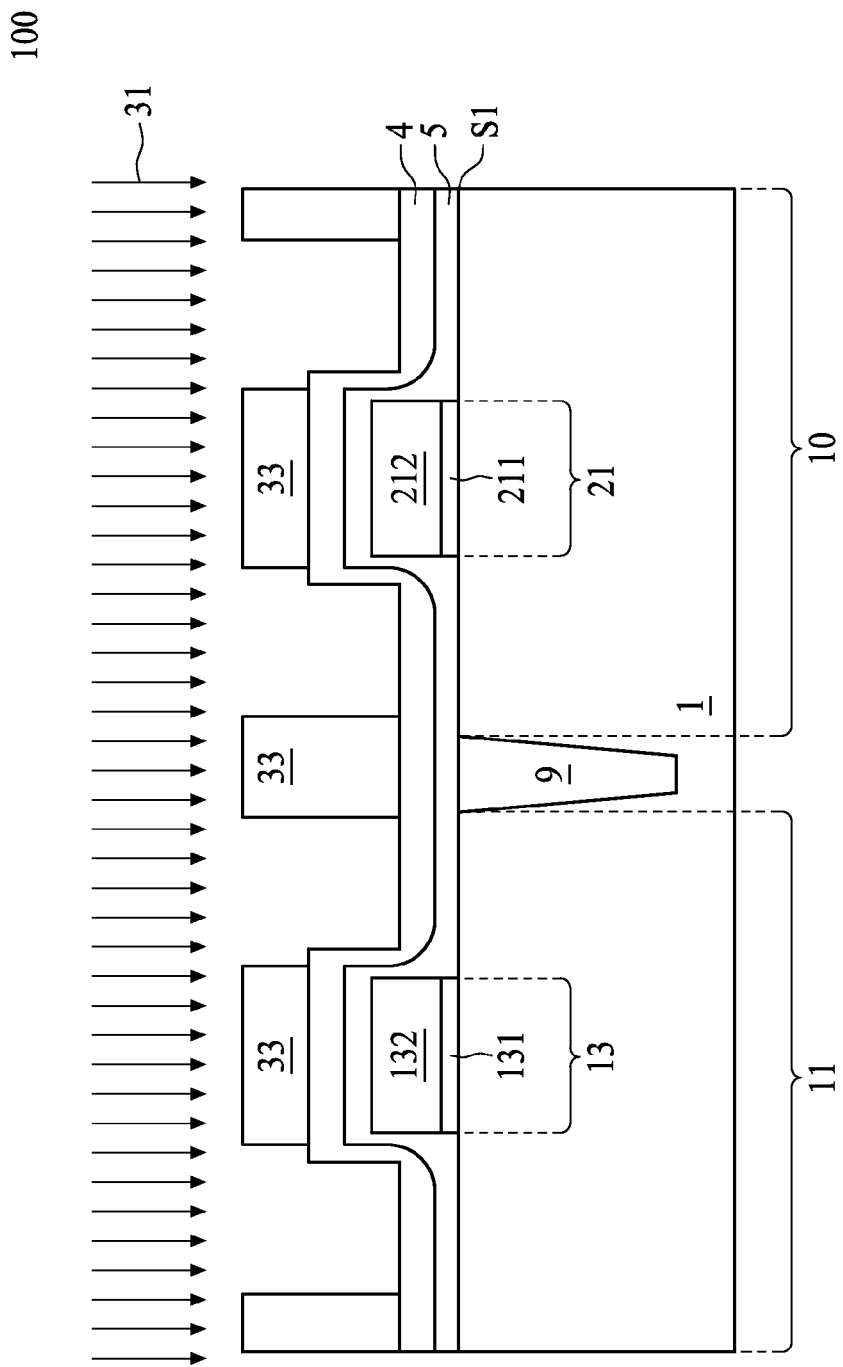

In FIG. 17, in some further embodiments, the nitride layer 4 is deposited over the oxide layer 5 before the doped regions are formed. The nitride layer 4 is covering the oxide layer 5 conformally by any suitable process such as the deposition process.

A mask 33 is patterned and covering over a portion of the nitride layer 4 and the semiconductive substrate 1. The portion of the nitride layer 4 is over the gate structure 21 and the logic gate structure 13. The mask 33 is exposing a doping region and covering a non-doping region. An ion implantation 31 is performed over the semiconductive substrate 1 to implant dopant into the exposed region in the semiconductive substrate 1. A rapid thermal annealing (RTA) process is used to activate an implanted dopant.

Figure 18:
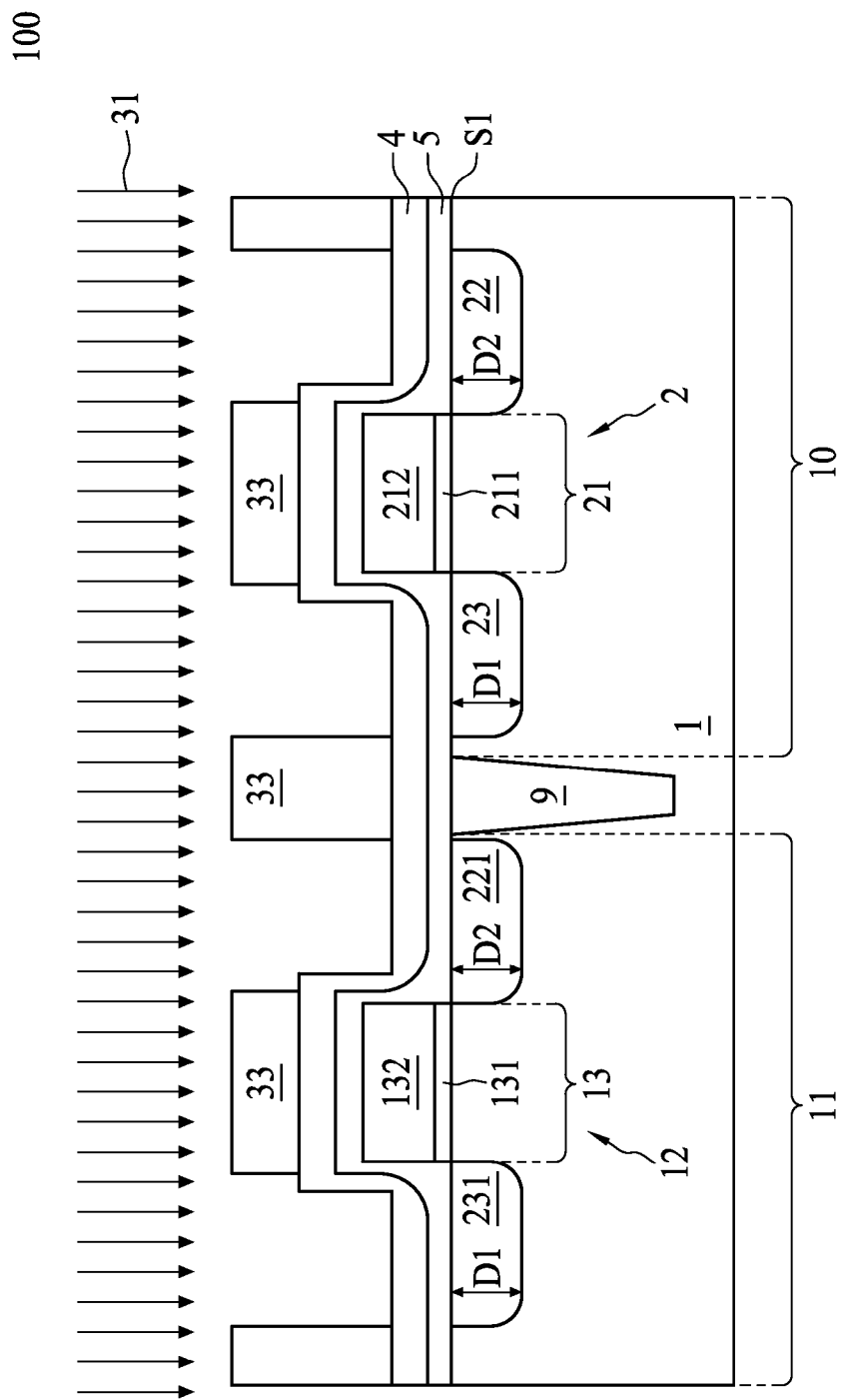

In FIG. 18, the logic source region 221, logic drain region 231, source region 22, and drain region 23 are formed under nitride layer 4 or oxide layer 5. Ion implantation 31 is performed over the semiconductive substrate 1 to introduce the p-type or n-type impurity in the logic source region 221, logic drain region 231, source region 22, and drain region 23. Depth D1 of logic drain region 231 and drain region 231 are controlled by some appropriate implantation energies. A depth D2 of logic source region 221 and source region 22 are controlled by some appropriate implantation energies.

Figure 19:
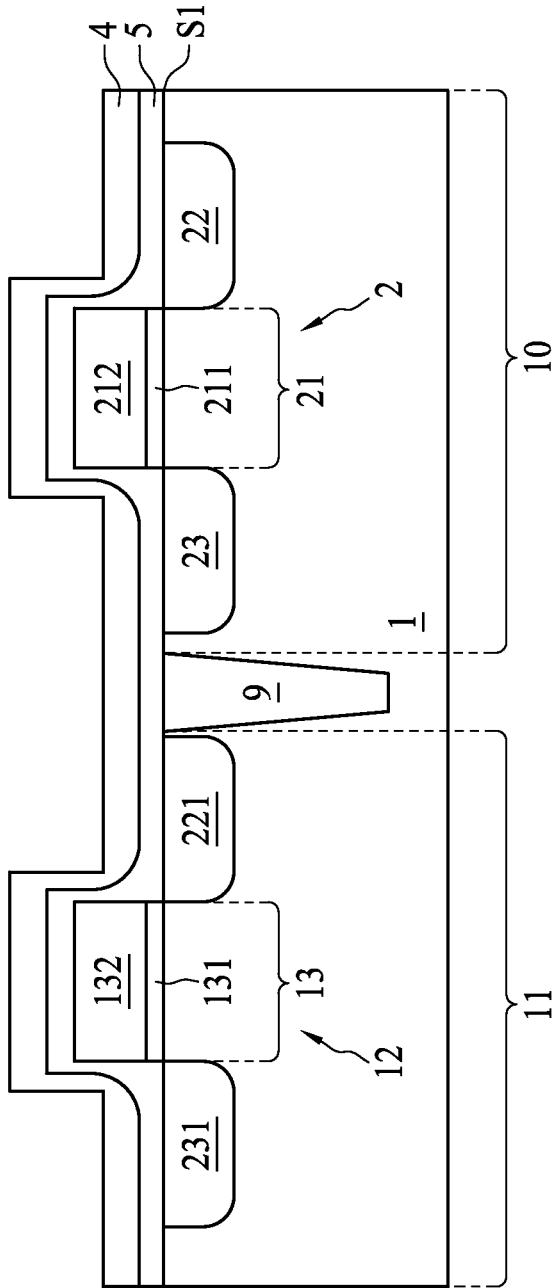

In FIG. 19, after logic source region 221, logic drain region 231, source region 22, and drain region 23 are formed; mask 33 is removed by using the wet etching process. The wet etching process is utilizing a hydrofluoric acid (HF) solution for a HF dipping process. Liquid chemical such as acids, bases, or solvents are used to chemically remove the mask 33. In some embodiments, the wet etching process is applying a diluted hydrofluoric acid to an intermediate structure. In some embodiments, the wet etching process includes exposing to a hydroxide solution containing ammonium hydroxide, diluted HF, deionized water, and/or other suitable etchant solutions.

In FIG. 19, the nitride layer 4 is covering conformally over the oxide layer 5 in the pixel region 10 and the logic region 11. The nitride layer 4 is exposed in the pixel region 10 and the logic region 11. The transistor 2 and the logic transistor 12 are covered under the nitride layer 4.

In FIG. 20, a resist 35 is formed over the gate structure 21 and the semiconductive substrate 1 in a pixel region 10. The resist 35 is patterned by any suitable process such as the lithographic process. Some etching processes 32 are preformed to remove the nitride layer 4 and the oxide layer 5 in the logic region 11. The etching process 32 is etching the nitride layer 4 and the oxide layer 5 over a portion 222 of the logic source region 221 and the logic drain region 231. A top portion 141 of the nitride layer 4 and a top portion 151 of the oxide layer 5 are etched by the etching process 32. In some embodiments, the etching processes 32 are a selective etching, the dry etching, or combination thereof.

The dry etching process is implemented in an etching chamber. Some process parameters in the dry etching process includes a radio frequency (RF) source power, a bias power, electrode size, a pressure, a flow rate, etching duration, a wafer temperature, other suitable process parameters, and/or combinations thereof. The dry etching process implements any suitable gas such as an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases (Ar and/or CH4) and/or plasmas, and/or combinations thereof. In some embodiments, the dry etching process utilizes an O2 plasma treatment and/or an O2/N2 plasma treatment. Further, the dry etching process can be performed for a suitable duration under certain pressure range from approximately 10 millitorr to 100 millitorr. Some process parameters such as etching durations and/or etch rate are adjustable to control some amounts of the nitride layer 4 and the oxide layer 5 removed.

The operation of removing the nitride layer 4 and the oxide layer 5 exposes the portion 222. Nitride layer 4 and oxide layer 5 over portions 121 of the semiconductive substrate 1 are removed. Portions 121 of the semiconductive substrate 1 are outside of a range covered under the logic gate structure 13 in the logic region 11. The resist 35 protects the nitride layer 4 and the oxide layer 5 in the pixel region 10 from etching. The resist 35 is removed after the etching process 32.

In FIG. 21, a remained portion of the oxide layer 5 is left on the surface S5 at a top of the transistor 2. A remained portion of the nitride layer 4 is left on top of the oxide layer 5. The surface S7 at a top of the logic gate structure 13 is exposed. The vertical oxide 15 and the vertical nitride 14 are left at either side of the logic gate structure 13. A top of the vertical oxide 15 and a top of the vertical nitride 14 are above the front side S1 by a height H2. In some embodiments, the top of the vertical oxide 15 and the top of the vertical nitride 14 are lower than the surface S7 after the etching. In the logic region 11, the vertical edge of the vertical nitride 14 is etched by the etching. The thickness TH7 of the vertical nitride 14 is reduced. A top of the remained portion of the nitride layer 4 is over the front side S1 by a height H1. In some embodiments, height H1 is higher than height H2.

Figure 22:
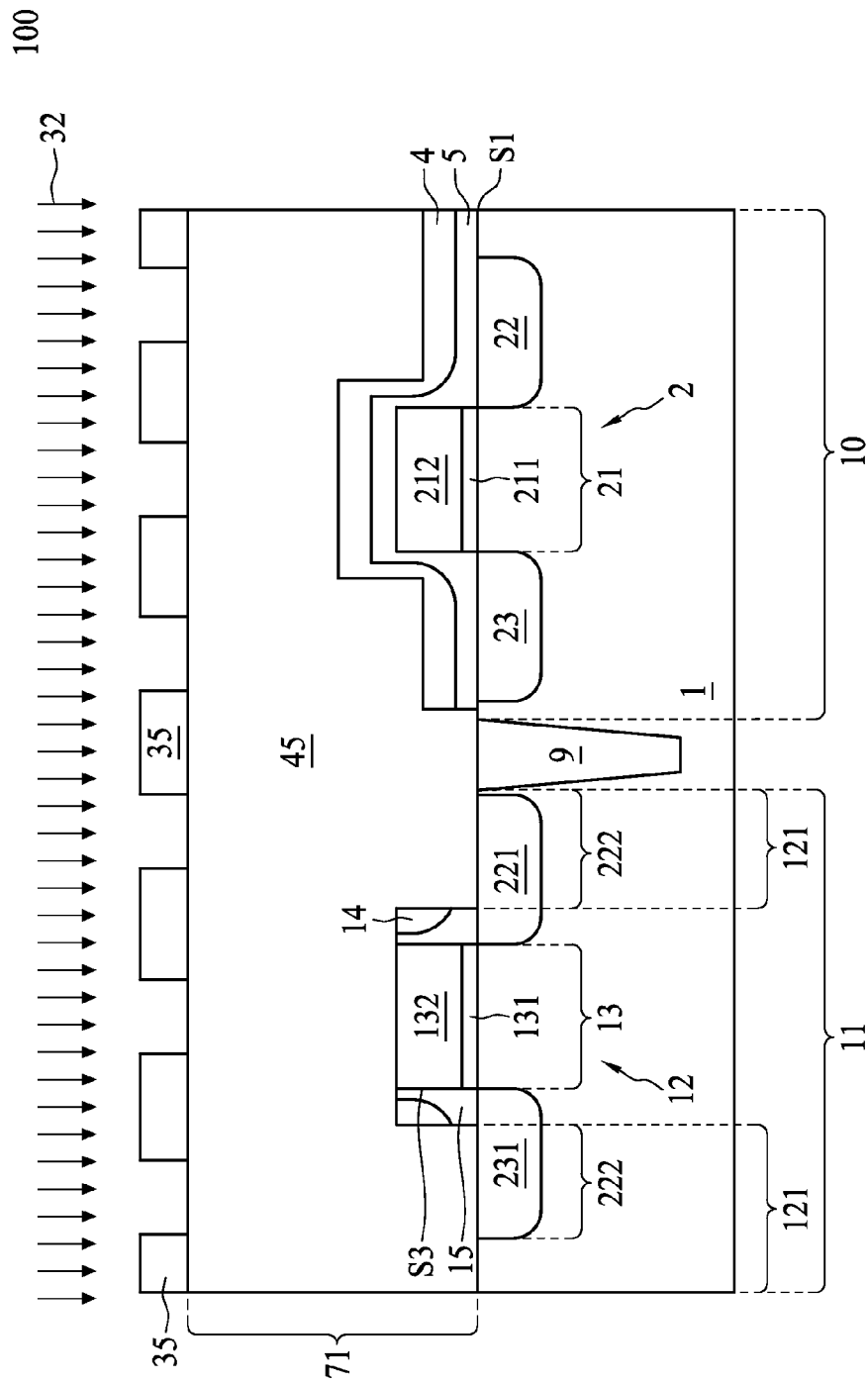

In FIG. 22, the dielectric layer 45 is covering over the semiconductive substrate 1 by any suitable process such as the deposition process. The dielectric layer 45 is in contact with the nitride layer 4 in the pixel region 10. The dielectric layer 45 is in contact with the semiconductive substrate 1 and the portion 222 of the logic source region 221 and the logic drain region 231 in the logic region 11. A resist 35 is formed on top of the dielectric layer 45. Some etching process 32 is performed to transfer a patterned resist feature to the dielectric layer 45.

Figure 23:
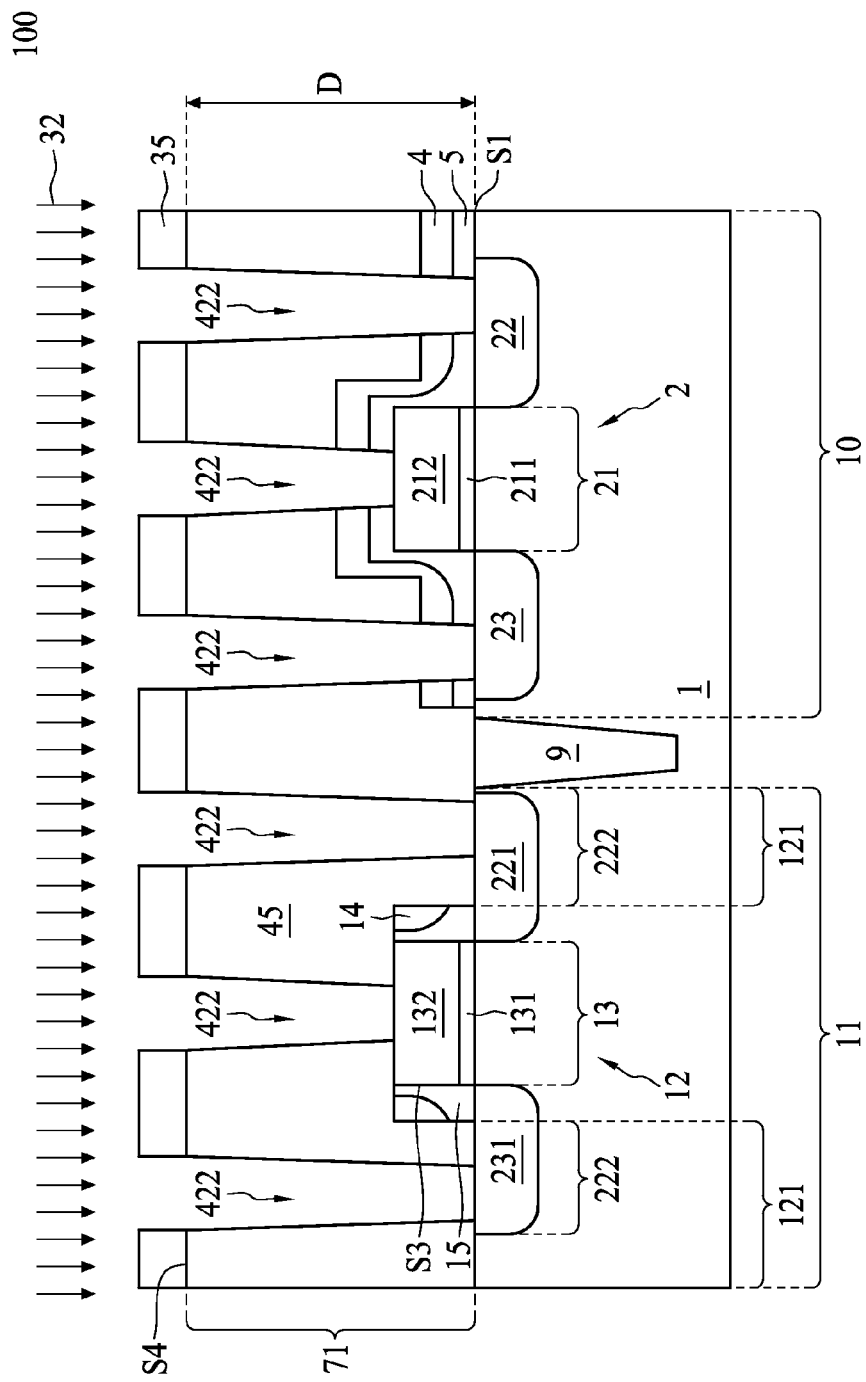

In FIG. 23, some trenches 422 are formed by the etching process 32. Trenches 422 are formed in some exposed region not covered by resist 35. The etching process 32 bores through the dielectric layer 45 and exposes some portions of logic gate electrode 132, the gate electrode 212, the logic source region 221, the logic drain region 231, the source region 22, and the drain region 23. In some embodiments, the etching processes 32 are the selective etching, the dry etching, and/or combination thereof.

The selective etching can use some fluorine-containing gas, HBr and/or Cl2 as etch gases. In some embodiments, a bias voltage used in the etching process 32 can be adjusted to allow better control of an etching direction to be isotropic or anisotropic in the dielectric layer 45. In some embodiments, in the pixel region 10, the selective etching includes a faster etching rate for the nitride layer 4 or the oxide layer 5 than for the semiconductive substrate 1 or the gate structure 21. In some other embodiments, in the logic region 11, the selective etching includes a faster etching rate for the dielectric layer 45 than for the semiconductive substrate 1. Different etchant can be used for etching different compositions of materials.

In some embodiments, trench 422 has high aspect ratio, which means a small opening at a top and a long trench depth. In some embodiments, the etching process 32 is a dry etching process. The dry etching process is performed for a suitable duration. Some process parameters such as etching durations and/or etch rate are adjustable to control a depth D of the trench 422. The depth D is from the surface S4 to the front side S1.

Figure 24:
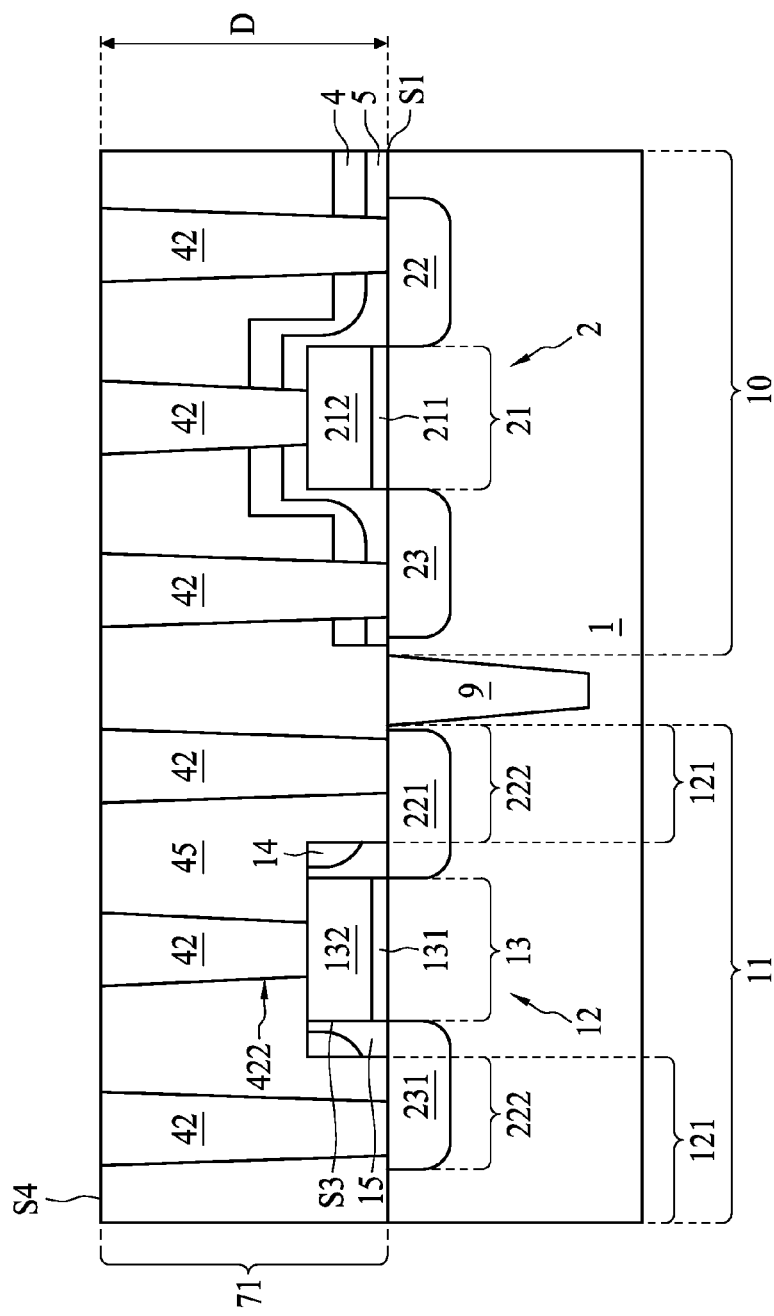

In FIG. 24, the trenches 422 are filled by some conductive materials to form contacts 42. Contacts 42 are formed by filling the trenches 422 by some suitable processes such as the deposition process. A filling is up to a surface S4 at a top of the ILD layer 71. Contacts 42 are electrically couple with the transistor 2 and the logic transistor 12. In some embodiments, contacts 42 are touching gate structure 21, the logic gate structure 13, the logic source region 221, the logic drain region 231, the source region 22, and the drain region 23. A depth D of the contacts 42 is controlled by adjusting some process parameters in a CVD process. The process parameters include a total pressure, some reactant concentrations, a deposition temperature, or a deposition rate.

In some embodiments, the deposition process is a HDP-CVD process used to fill trenches 422 by using a simultaneous deposition and etching action. In some embodiment, a conductive material is blanket-deposited (CVD) into trenches 422. Subsequently, a planarization process removes some excess blanket layer. The planarization includes a chemical mechanical planarizing (CMP), or a dry plasma etchback. The contacts 42 and the dielectric layer 45 are formed in an ILD layer 71.

Figure 25:
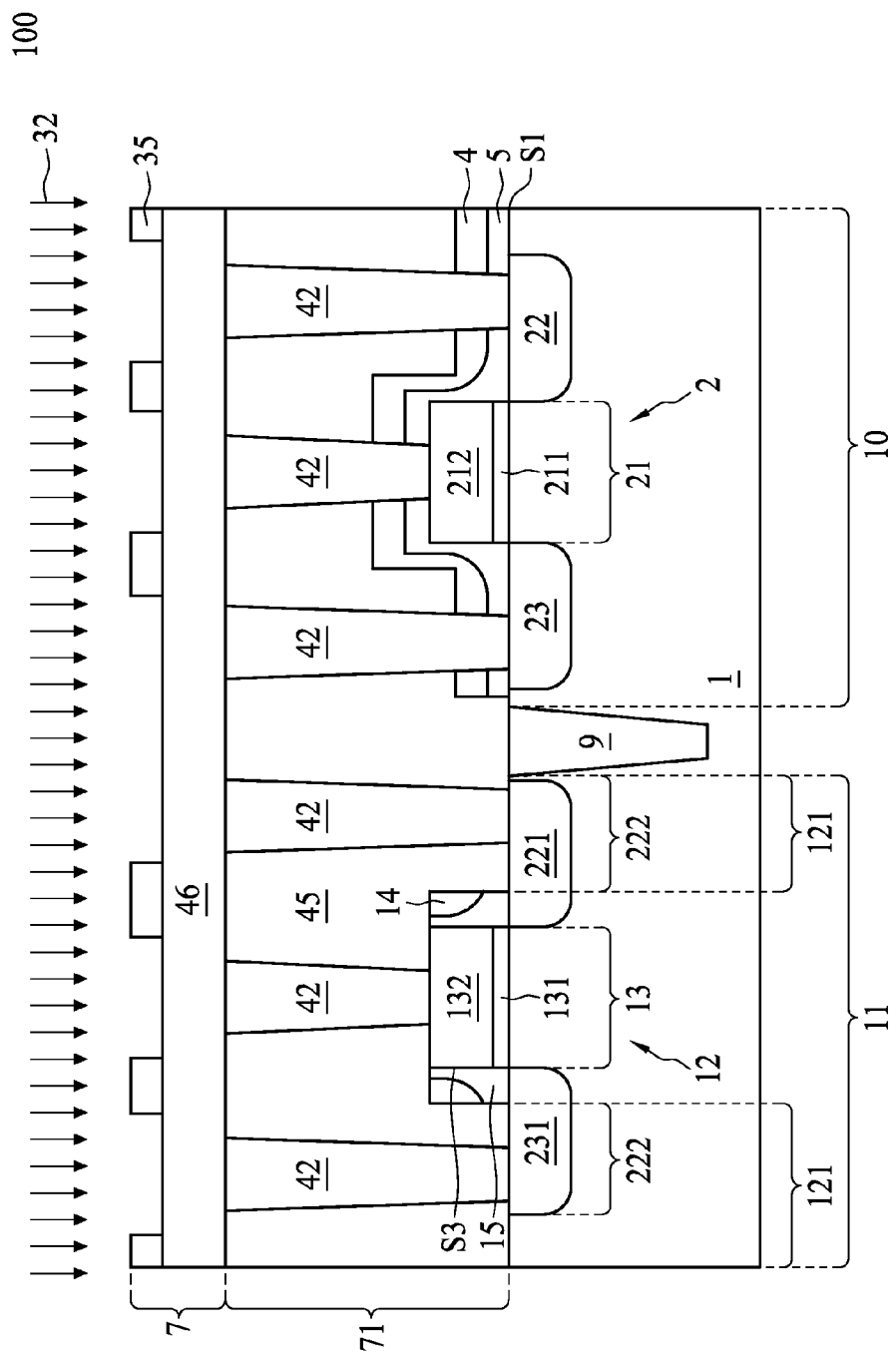

In FIG. 25, a dielectric layer 46 is covering on top of the dielectric layer 45 and the contacts 42. A resist 35 is formed and patterned on top of the dielectric layer 46. The etching process 32 transfers some resist features to the dielectric layer 46. The dielectric layer 46 is formed in the redistribution layer 7. The redistribution layer 7 is on top of the ILD layer 71.

Figure 26:
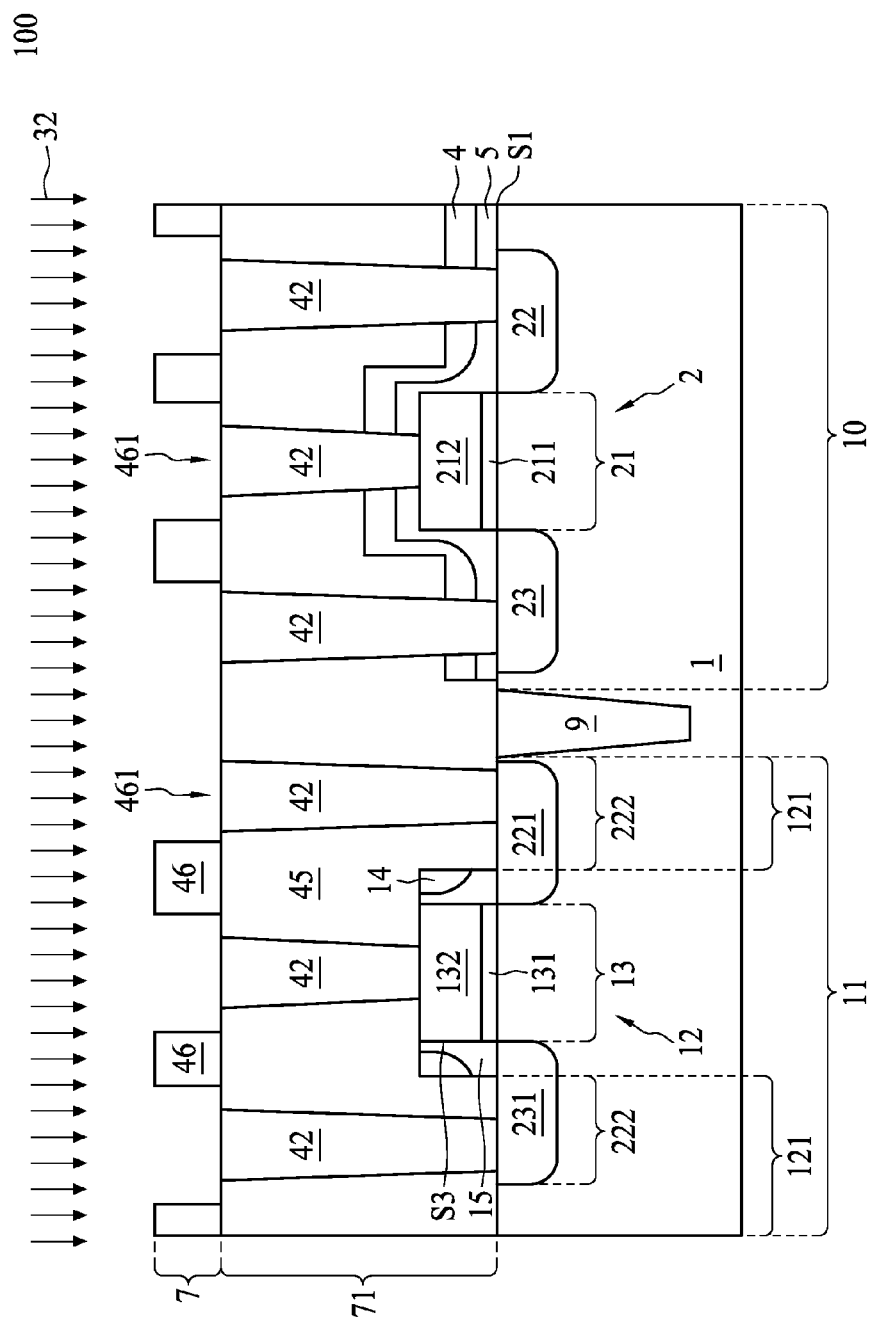
Figure 27:
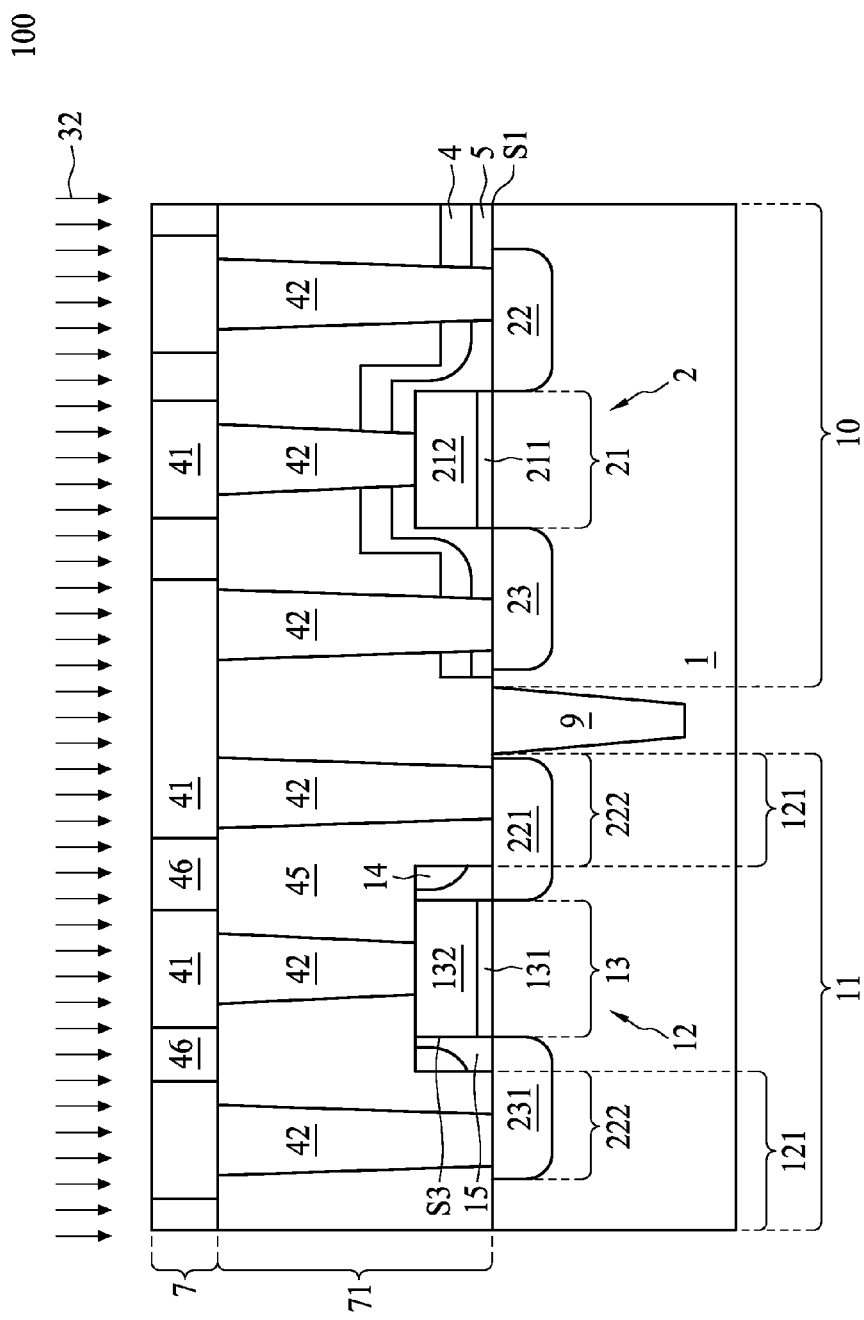

In FIG. 26, the dielectric layer 46 is patterned with openings 461 to be filled by some conductive materials by any suitable process such as the deposition process. In FIG. 27, the conductive materials fill the openings 461 to form the interconnections 41.

In some embodiments, a HDPCVD process is used to fill the openings 461 by using a simultaneous deposition and etching action. The conductive material is blanket-deposited (CVD) into the openings 461. Subsequently, dry plasma etch back removes some excess blanket layers to lower the conductive material. In some embodiments, a planarization, such as CMP, is used to remove the excess blanket layers to form the interconnections 41 coplanar with the dielectric layer 46.

Figure 28:
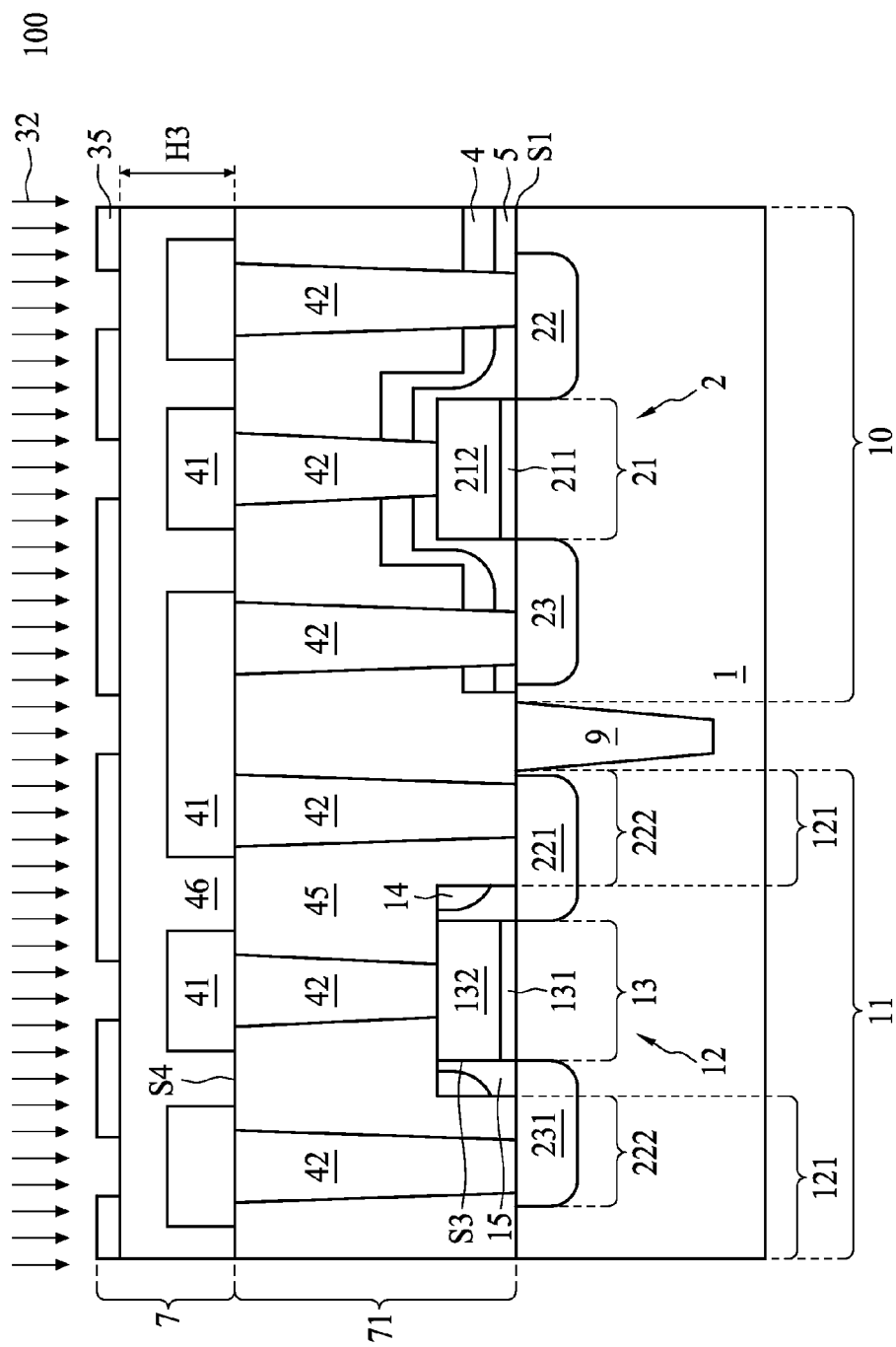

In FIG. 28, some additional dielectric materials are covering over the interconnections 41 to increase the dielectric layer 46 up to a height H3 from surface S4. A resist 35 is formed and patterned on top of the dielectric layer 46. Some resist features left some portions of the dielectric layer 46 exposed to the etching process 32. The resist features on the resist 35 is transferred by the etching process 32 to the dielectric layer 46.

In some other embodiments, the operation of forming the interconnection 41 is by depositing the conductive layer and patterned the conductive layer with some recesses (not shown) to form the interconnections 41. The recesses are to be filled by some dielectric materials to form the dielectric layer 46 over the ILD layer 71. The dielectric materials are covering over the interconnections 41. A planarization is performed to lower some excess dielectric materials to a height H3 over the surface S4 of the ILD layer 71.

Figure 29:
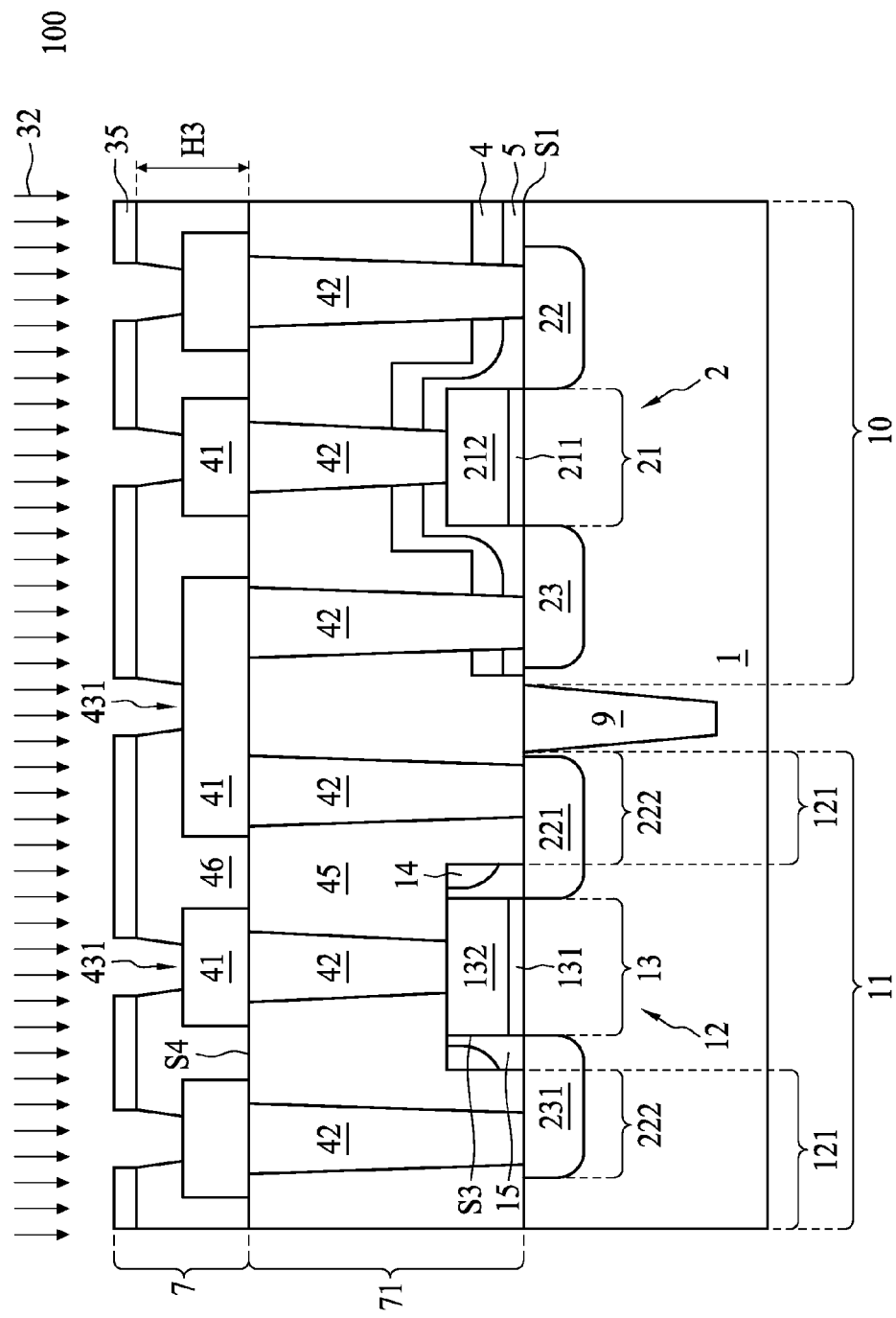

In FIG. 29, the etching process 32 lowers some exposed portion of the dielectric layer 46 to form recesses 431. The etching process 32 exposes some portions of the interconnection 41. The resist 35 is stripped thereafter.

Figure 30:
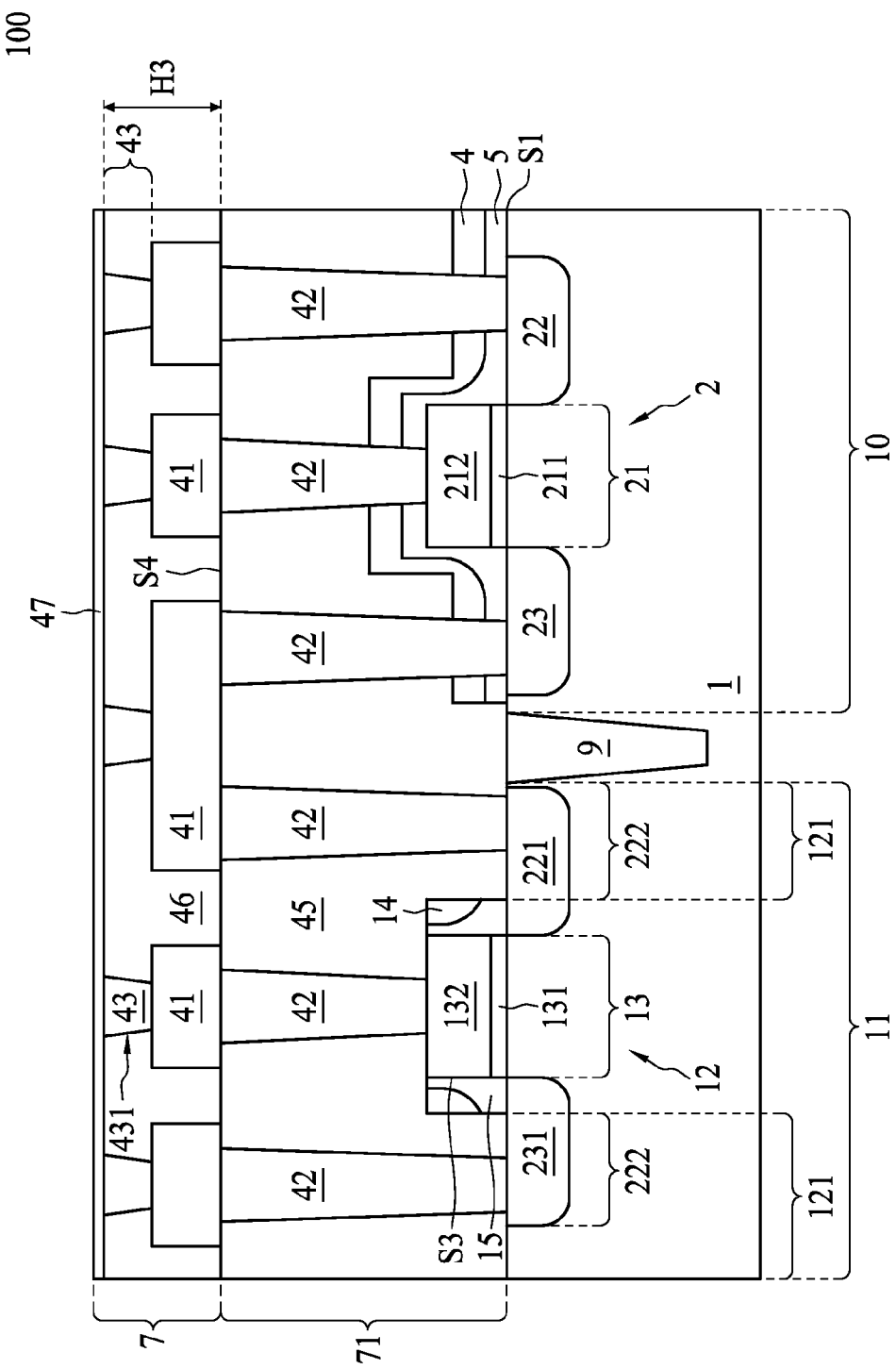

In FIG. 30, a conductive material is filled inside the recess 431 to form via 43. The via 43 is filled up to a height H3 above the surface S4 such that the vias 43 are coplanar with a top of the dielectric layer 46. In some embodiments, dielectric etch stop layer 47 is formed over the via 43 and the dielectric layer 46.

Figure 31:
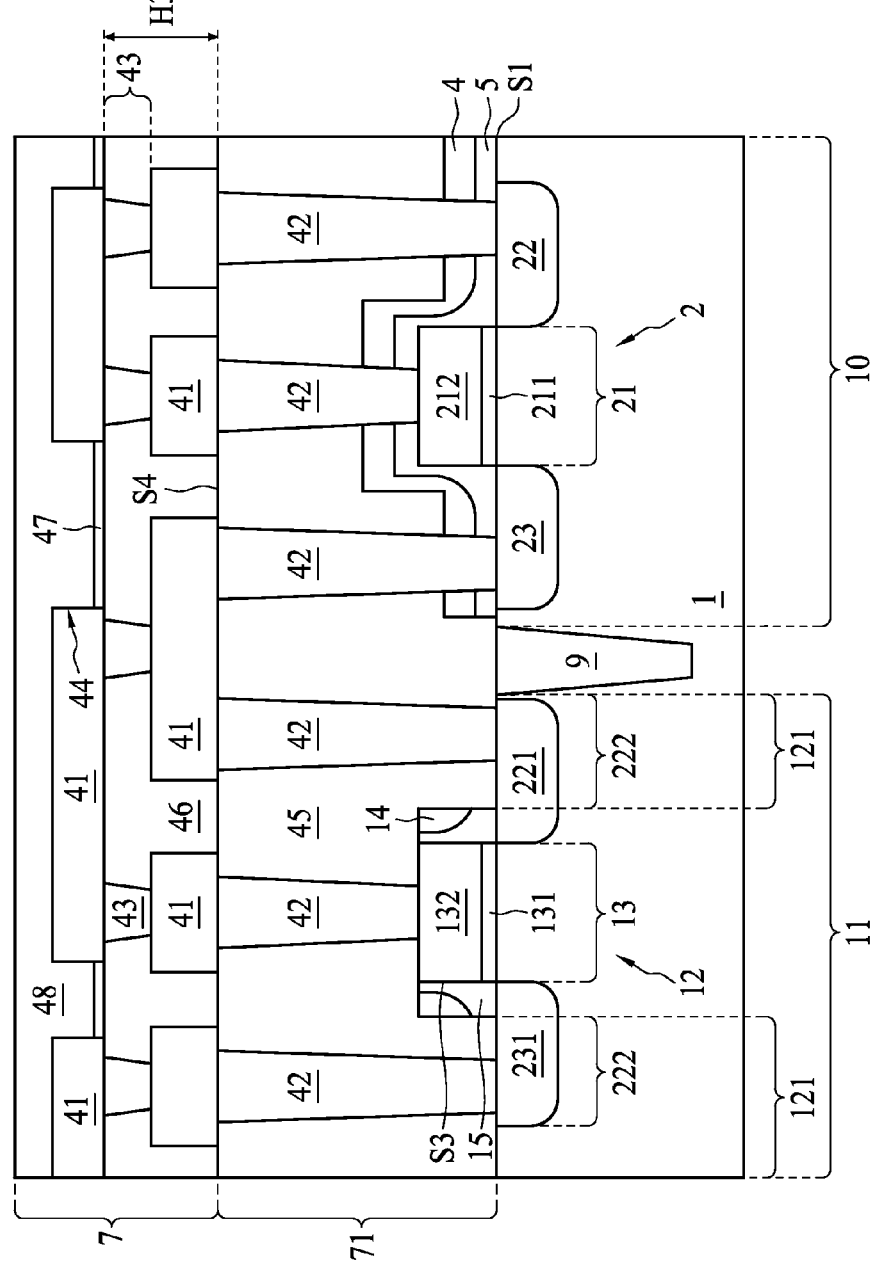

In FIG. 31, the dielectric etch stop layer 47 is patterned by the lithographic process to expose some portions of the dielectric layer 46 and the vias 43. A conductive layer is covering over the dielectric etch stop layer 47 and in contact with the portions of the dielectric layer 46 and the vias 43. The conductive layer is patterned by another lithographic process to form recess 44. The dielectric etching stop layer 47 protects an underlying dielectric layer 46 from some etching processes in the lithographic process. Another dielectric layer 48 is covering over the interconnection 41 and the dielectric etch stop layer 47. The dielectric layer 48 is filling inside the recess 44.

Figure 32:
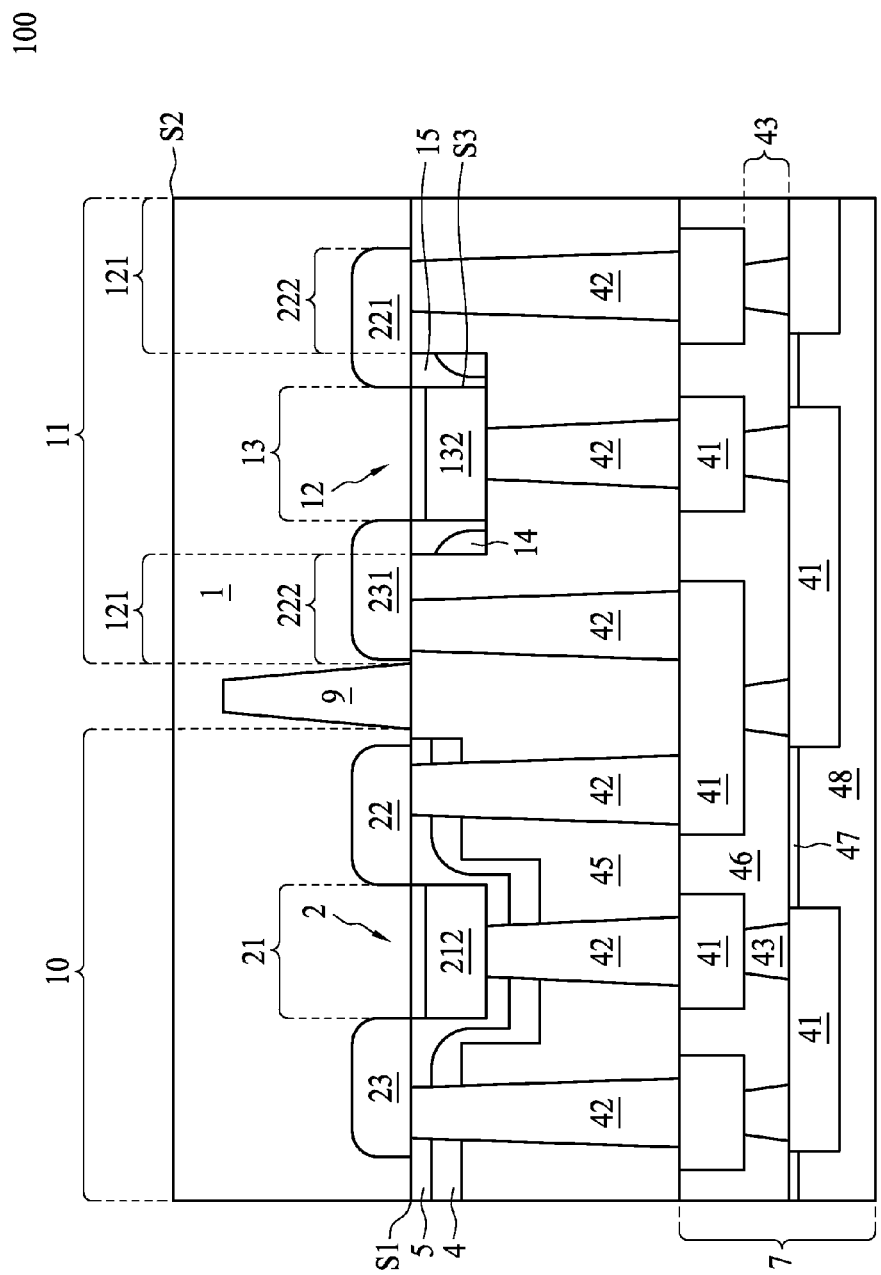

In FIG. 32, the image sensor 100 is flipped upside down such that the back side S2 of the semiconductive substrate 1 is above the front side S1. The back side S2 is exposed.

In FIG. 33, the multilayer structure is formed on top of the back side S2 in the pixel region 10. The first transmitting layer 81, the second transmitting layer 82, and the capping layer 83 are formed sequentially by the deposition processes such as CVD, PECVD, or other suitable methods. The color filter 84 is formed over the capping layer 83 and aligned within the pixel region 10. In some embodiments, the color filter 84 is formed by some suitable method such as a pigment diffusion method using a color resist. In some other embodiments, the color filter 84 is formed by pigment diffusion method using etching method, dyeing method, or combination thereof.

Figure 34:
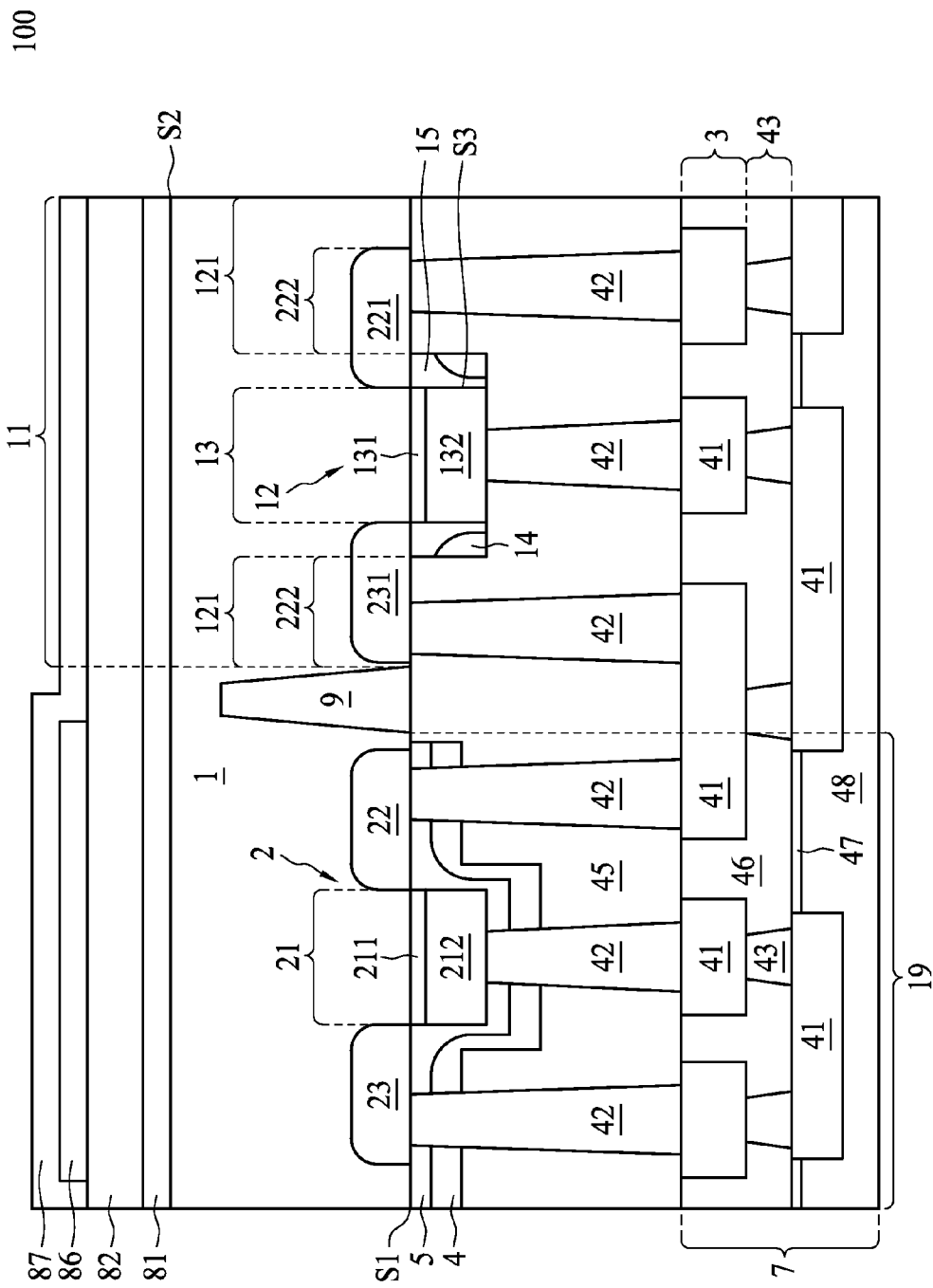

In FIG. 34, the black level reference pixels 19 is formed by forming the light shielding layer 86 on the second transmitting layer 82. The light shielding layer 86 is formed by the deposition process includes depositing a metal layer (or a layer of another opaque material) over the second transmitting layer 82. The deposited layer is etched to leave the light shielding layer 86 in a region corresponding to the black level reference pixels 19. The passivation layer 87 is blanket formed over the light shielding layer 86 and the second transmitting layer 82.

Some embodiments of the present disclosure provide a back side illuminated (BSI) image sensor. BSI image sensor includes a semiconductive substrate, a dielectric layer over the semiconductive substrate, and a pixel region. The pixel region includes a transistor disposed at a front side of the semiconductive substrate. The transistor includes a gate structure and at least a source region or a drain region. The transistor is coupled to a contact disposed in the dielectric layer. An oxide layer covers the gate structure and at least the source region or the drain region. A nitride layer covers the gate structure and at least the source region or the drain region. A color filter is disposed at a back side of the semiconductive substrate.

Some embodiments of the present disclosure provide a back side illuminated (BSI) image sensor. BSI image sensor includes a semiconductive substrate, a pixel region, and a logic region in the semiconductive substrate. A transistor is disposed at a front side of the semiconductive substrate in the pixel region. The transistor includes a gate structure and at least a source region or a drain region. A nitride layer and an oxide layer overlie the gate structure and at least the source region or the drain region. A logic transistor is disposed in the logic region. The logic transistor includes a logic gate structure and at least a logic source region or a logic drain region. A dielectric layer is above the front side of the semiconductive substrate. A color filter is disposed at a back side of the semiconductive substrate.

Some embodiments of the present disclosure provide a method of manufacturing a back side illuminated (BSI) image sensor. The method includes receiving a semiconductive substrate; forming a gate structure on a front side of the semiconductive substrate in a pixel region; forming a logic gate structure on the semiconductive substrate in a logic region; forming an oxide layer over the gate structure, the logic gate structure, and the semiconductive substrate; forming a nitride layer over the gate structure, the logic gate structure, and the semiconductive substrate; forming a resist over the gate structure and the semiconductive substrate in the pixel region; forming a logic source region or a logic drain region proximate to the logic gate structure; removing the nitride layer over a portion of the logic source region or the logic drain region in the logic region; forming a dielectric layer over the semiconductive substrate; and forming a color filter at a back side of the semiconductive substrate in the pixel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illuminated (BSI) image sensor, comprising:
   a semiconductive substrate;
   a pixel region and a logic region in the semiconductive substrate;
   a transistor disposed at a front side of the semiconductive substrate and in the pixel region, wherein
   the transistor comprises a pixel gate structure and at least one of a pixel source region or a pixel drain region; and
   a photo-sensitive element disposed in the pixel region and coupled to the transistor;
   a logic transistor disposed at the front side and in the logic region, wherein
   the logic transistor comprises a logic gate structure and at least one of a logic source region or a logic drain region;
   an oxide layer covering the pixel gate structure and the at least one of the pixel source region or the pixel drain region;
   a nitride layer covering the pixel gate structure and the at least one of the pixel source region or the pixel drain region;
   a dielectric layer formed over the oxide layer and the nitride layer and formed in contact with a portion of the at least one of the logic source region or the logic drain region; and
   a color filter disposed at a back side of the semiconductive substrate.

2. The BSI image sensor of claim 1, wherein the nitride layer separates the dielectric layer from the transistor.

3. The BSI image sensor of claim 1, wherein the oxide layer is between the nitride layer and the semiconductive substrate.

4. The BSI image sensor of claim 3, wherein
   a ratio between a first thickness of the nitride layer and a second thickness of the oxide layer is approximately 2.4;
   the first thickness is measured from the front side to a first top surface of a portion of the oxide layer over the at least one of the pixel source region or the pixel drain region; and
   the second thickness is measured from the first top surface to a second top surface of a portion of the nitride layer over the at least one of the pixel source region or the pixel drain region.

5. The BSI image sensor of claim 1, further comprising another oxide layer overlying on top of the nitride layer.

6. The BSI image sensor of claim 1, further comprising:
   at least one contact disposed in the dielectric layer and coupled to the transistor.

7. The BSI image sensor of claim 6, further comprising a redistribution layer over the dielectric layer, wherein the redistribution layer comprises an interconnection coupling with the at least one contact.

8. The BSI image sensor of claim 6, wherein the at least one contact pass through the dielectric layer, the oxide layer and the nitride layer such that the at least one contact connect with the pixel gate structure, and the at least one of the pixel source region or the pixel drain region.

9. A back side illuminated (BSI) image sensor, comprising:
a semiconductive substrate;
a pixel region and a logic region in the semiconductive substrate;
a transistor disposed at a front side of the semiconductive substrate and in the pixel region, wherein
the transistor comprises a pixel gate structure and at least one of a pixel source region or a pixel drain region;
a photo-sensitive element disposed in the pixel region and coupled to the transistor;
a nitride layer and an oxide layer overlying with a first portion on top of the pixel gate structure and a second portion on one side of the pixel gate structure and overlying the pixel source region or the pixel drain region with the second portion and a third portion discontinuous in vertical thickness with respect to the second portion;
a logic transistor disposed at the front side and in the logic region, wherein
the logic transistor comprises a logic gate structure and at least one of a logic source region or a logic drain region, wherein
the nitride layer and the oxide layer does not overlie on top of the logic gate structure, overlies on one side of the logic gate structure with a fourth portion and overlies the logic source region or the logic drain region with the fourth portion and not with a fifth portion discontinuous in vertical thickness with respect to the fourth portion; and
a color filter disposed at a back side of the semiconductive substrate.

10. The BSI image sensor of claim 9, wherein the nitride layer is over the oxide layer and the front side of the semiconductive substrate.

11. The BSI image sensor of claim 10, wherein
a ratio between a first thickness of the nitride layer and a second thickness of the oxide layer is approximately 2.4;
the first thickness is measured from the front side to a first top surface of a portion of the oxide layer over the at least one of the pixel source region or the pixel drain region; and
the second thickness is measured from the first top surface to a second top surface of a portion of the nitride layer over the at least one of the pixel source region or the pixel drain region.

12. The BSI image sensor of claim 9, further comprising:
a dielectric layer above the front side.

13. The BSI image sensor of claim 12, wherein the dielectric layer is separated from the at least one of the pixel source region or the pixel drain region by the nitride layer in the pixel region.

14. The BSI image sensor of claim 12, wherein the dielectric layer is in contact with a portion of the at least one of the logic source region or the logic drain region in the logic region.

15. The BSI image sensor of claim 12, wherein the transistor in the pixel region and the logic transistor in the logic region are coupled through contacts in the dielectric layer and an interconnection in a redistribution layer.

16. A back side illuminated (BSI) image sensor, comprising:
a semiconductive substrate having a front side;
a pixel region comprising:
a first transistor comprising:
a first gate structure over the front side;
a first gate spacer over a first side wall of the first gate structure;
a first source or drain region under the front side and adjacent to the first side wall; and
a first gate spacer extension extended from the first gate spacer and covering the first source or drain region; and
a photo-sensitive element coupled to the first transistor; and
a logic region comprising:
a second transistor comprising:
a second gate structure over the front side;
a second gate spacer formed over a second side wall of the second gate structure; and
a second source or drain region under the front side and adjacent to the second side wall, wherein
the second transistor does not comprise a second gate spacer extension extended from the second gate spacer and covering the second source or drain region;
each of the first gate spacer, the first gate spacer extension, the second gate spacer comprises:
a corresponding portion of a first oxide layer; and
a corresponding portion of a nitride layer; and
the nitride layer covers the first oxide layer.

17. The BSI image sensor of claim 16, further comprising:
a dielectric layer over the front side, wherein the gate spacer and the gate spacer extension separates the dielectric layer from the first source or drain region.

18. The BSI image sensor of claim 16, wherein the first oxide layer has a substantially uniform thickness from the front side to a surface where the first oxide layer is in contact with the nitride layer.

19. The BSI image sensor of claim 16, wherein each of the first gate spacer and the first gate spacer extension further comprises a corresponding portion of a second oxide layer, and the second oxide layer covers the nitride layer.

20. The BSI image sensor of claim 16, wherein
a ratio between a first thickness of the nitride layer and a second thickness of the oxide layer is approximately 2.4;
the first thickness is measured from the front side to a first top surface of the portion of the oxide layer corresponding to the first gate spacer extension; and
the second thickness is measured from the first top surface to a second top surface of the portion of the nitride layer corresponding to the first gate spacer extension.

* * * * *